(12) United States Patent
Ono et al.

(10) Patent No.: US 12,185,547 B2
(45) Date of Patent: Dec. 31, 2024

(54) SEMICONDUCTOR SUBSTRATE AND SEMICONDUCTOR DEVICE

(71) Applicant: KIOXIA CORPORATION, Tokyo (JP)

(72) Inventors: Takanobu Ono, Kuwana (JP); Yusuke Dohmae, Kuwana (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/469,666

(22) Filed: Sep. 19, 2023

(65) Prior Publication Data

US 2024/0008277 A1    Jan. 4, 2024

Related U.S. Application Data

(63) Continuation of application No. 17/167,767, filed on Feb. 4, 2021, now Pat. No. 11,800,709, which is a continuation of application No. 16/285,268, filed on Feb. 26, 2019, now Pat. No. 10,950,621.

(30) Foreign Application Priority Data

Aug. 17, 2018  (JP) .................................. 2018-153574
Nov. 27, 2018  (JP) .................................. 2018-221676

(51) Int. Cl.
| | | |
|---|---|---|
| H10B 43/27 | (2023.01) | |
| H01L 21/28 | (2006.01) | |
| H01L 21/822 | (2006.01) | |
| H01L 29/423 | (2006.01) | |
| H10B 43/35 | (2023.01) | |

(52) U.S. Cl.
CPC ........... *H10B 43/27* (2023.02); *H01L 21/822* (2013.01); *H01L 29/40117* (2019.08); *H01L 29/42344* (2013.01); *H10B 43/35* (2023.02)

(58) Field of Classification Search
CPC ..................... H01L 29/40117; H01L 29/42344
See application file for complete search history.

(56) References Cited

U.S. PATENT DOCUMENTS

| | | |
|---|---|---|
| 7,211,526 B2 | 5/2007 | Iri et al. |
| 7,852,675 B2 | 12/2010 | Maejima |
| 8,026,154 B2 | 9/2011 | Sakamoto |
| 8,368,181 B2 | 2/2013 | Suzuki et al. |
| 8,786,055 B2 | 7/2014 | Kawashima |
| 8,952,426 B2 | 2/2015 | Maejima |

(Continued)

FOREIGN PATENT DOCUMENTS

| | | |
|---|---|---|
| JP | 2004-55852 | 2/2004 |
| JP | 2005-268752 | 9/2005 |

(Continued)

*Primary Examiner* — Walter H Swanson
(74) *Attorney, Agent, or Firm* — Oblon, McClelland, Maier & Neustadt, L.L.P.

(57) ABSTRACT

A semiconductor wafer according to the present embodiment includes a plurality of semiconductor chip regions and a division region. The plurality of semiconductor chip regions have a semiconductor element. The division region is provided between the semiconductor chip regions adjacent to each other. A first stacked body is provided on the division region. The first stacked body is configured with a plurality of first material films and a plurality of second material films alternately stacked.

14 Claims, 19 Drawing Sheets

(56) References Cited

U.S. PATENT DOCUMENTS

| | | |
|---|---|---|
| 2006/0163699 A1 | 7/2006 | Kumakawa et al. |
| 2010/0109065 A1 | 5/2010 | Oh et al. |
| 2011/0284946 A1 | 11/2011 | Kiyotoshi |
| 2016/0071872 A1 | 3/2016 | Saito et al. |
| 2016/0268166 A1 | 9/2016 | Nakajima |
| 2017/0294377 A1 | 10/2017 | Dunga et al. |
| 2017/0338243 A1 | 11/2017 | Sohn |
| 2019/0214405 A1* | 7/2019 | Shirai ............... H01L 29/40117 |

FOREIGN PATENT DOCUMENTS

| | | |
|---|---|---|
| JP | 2006-203002 | 8/2006 |
| JP | 2008-16486 | 1/2008 |
| JP | 2009-158589 | 7/2009 |
| JP | 2011-114261 | 6/2011 |
| JP | 2014-17437 A | 1/2014 |
| JP | 2016-58454 A | 4/2016 |

\* cited by examiner

SEMICONDUCTOR SUBSTRATE AND SEMICONDUCTOR DEVICE

CROSS REFERENCE TO RELATED APPLICATIONS

This application is a continuation of and claims benefit under 35 U.S.C. § 120 to U.S. application Ser. No. 17/167,767, filed Feb. 4, 2021, which is a continuation of and claims benefit under 35 U.S.C. § 120 to U.S. application Ser. No. 16/285,268, filed Feb. 26, 2019 (now U.S. Pat. No. 10,950,621), and is based upon and claims the benefit of priority under 35 U.S.C. 10 § 119 from Japanese Patent Application No. 2018-153574, filed Aug. 17, 2018 and claims the benefit of priority under 35 U.S.C. § 119 from Japanese Patent Application No. 2018-221676, filed Nov. 27, 2018, the entire contents of each of which are incorporated herein by reference.

FIELD

The embodiments of the present invention relate to a semiconductor substrate and a semiconductor device.

BACKGROUND

A laser dicing technique is a method using a laser to modify the inside of a semiconductor wafer to cleave the semiconductor wafer from a modified portion as the starting point. However, since a cleavage that spreads from the modified portion has low straightness, a material film located on a dicing line of the semiconductor wafer is not divided in straight, so that a division line may meander. After the modification with the laser, when the semiconductor wafer is thinned in a polish process, the division line of the material film may further curve largely, so that a crack may reach a device region inside a semiconductor chip.

DETAILED DESCRIPTION

Figure 1:
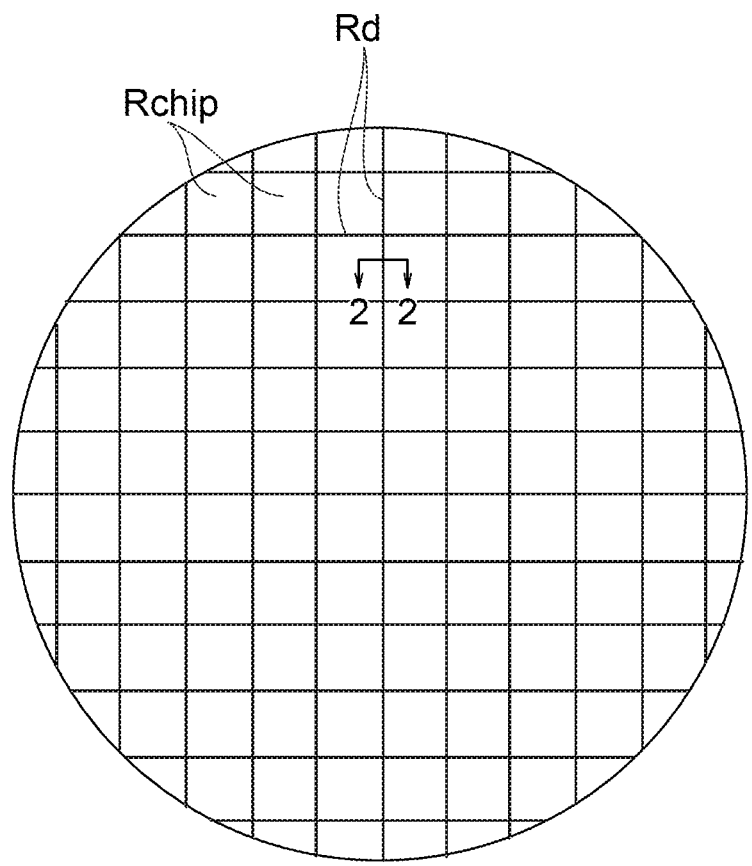
FIG. 1 is a schematic plan view showing an example of a semiconductor wafer in accordance with a first embodiment.

Embodiments will now be explained with reference to the accompanying drawings. The present invention is not limited to the embodiments. In the embodiments, "an upper direction" or "a lower direction" refers to a relative direction when a direction of a surface of a semiconductor substrate on which semiconductor elements are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor wafer according to the present embodiment includes a plurality of semiconductor chip regions and a division region. The plurality of semiconductor chip regions have a semiconductor element. The division region is provided between the semiconductor chip regions adjacent to each other. A first stacked body is provided on the division region. The first stacked body is configured with a plurality of first material films and a plurality of second material films alternately stacked.

First Embodiment

FIG. 1 is a schematic plan view showing an example of a semiconductor wafer in accordance with a first embodiment. A semiconductor wafer W is provided with a plurality of chip regions Rchip and a plurality of dicing regions Rd. The chip regions Rchip and the dicing regions Rd are regions on a front surface (a first face) F1 of the semiconductor wafer W. In each chip region Rchip as a semiconductor chip region, a semiconductor element (not shown in FIG. 1), such as a transistor and a memory cell array, is provided. The semiconductor element is formed on the semiconductor wafer W through a semiconductor manufacturing process. Each dicing region Rd as a division region is a line-like region between the chip regions Rchip adjacent to each other, which is a region to be cut by dicing. The dicing region Rd is also referred to as a dicing line. According to the present embodiment, a laser beam is emitted to form a modified layer inside a substrate 10 in the dicing region Rd, and then the semiconductor wafer W is cleaved at the modified layer as a starting point. In this way, the semiconductor wafer W is chipped per chip region Rchip into semiconductor chips.

Figure 2:
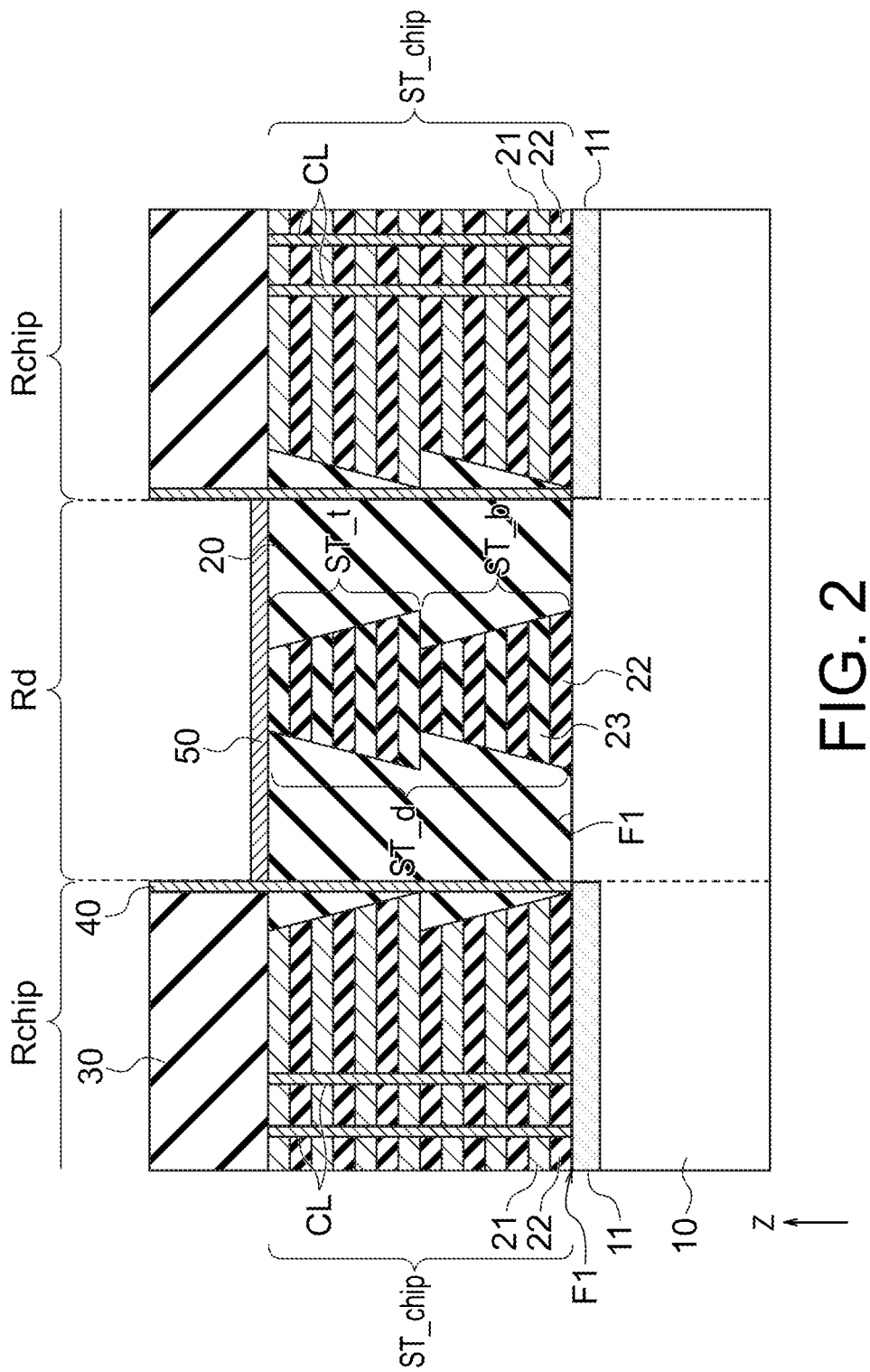
FIG. 2 is a sectional view taken on line 2-2 of FIG. 1.

FIG. 2 is a sectional view taken on line 2-2 of FIG. 1. The semiconductor wafer W is provided with the substrate 10, control circuits 11, stacked bodies ST_chip and ST_d, an interlayer insulating film 20, a passivation film 30, a guard ring 40, and a metal film 50. In the present embodiment, the semiconductor wafer W is provided with semiconductor memory devices such as NAND flash memories. Memory cell arrays of the semiconductor memory devices are, for example, a three-dimensional memory cell array of three-dimensionally arranged memory cells. In FIG. 2, in order to make it easy to see, the memory cell arrays are simply shown as the stacked bodies ST_chip. Hereinbelow, silicon is exemplified as a semiconductor, however, another semiconductor, other than silicon, may also be used.

The substrate 10 is, for example, a semiconductor substrate such as a silicon substrate. It is defined that the substrate 10 is a substrate before the semiconductor manufacturing process whereas the semiconductor wafer W is a substrate after the semiconductor manufacturing process. Therefore, it is defined that the semiconductor wafer W is the substrate 10 having semiconductor elements, interlayer insulating films, etc.

The control circuits 11 are provided on the substrate 10, as part of the semiconductor elements. Each control circuit 11 is provided under the associated each stacked body ST_chip, to control the stacked body ST_chip (that is, a memory cell array). The control circuit 11 is configured, for example, with a CMOS (Complementary Metal Oxide Semiconductor) circuit.

The stacked body ST_chip as a second stacked body is provided on each chip region Rchip of the substrate 10. The stacked body ST_chip is configured with conductive films 21 and first insulating films 22 alternately stacked, having columnar portions CL in its inside. A memory cell MC is configured at a cross point of the stacked body ST_chip and each columnar portion CL. The detailed configuration of the columnar portion CL and the memory cell MC will be explained later with reference to FIG. 3 and FIG. 4.

As for the conductive films 21, a conductive metal, such as tungsten, is used. As for the first insulating films 22 each as a first material film, an insulative material, such as a silicon oxide film, is used. The conductive films 21 each function as a word line. Each first insulating film 22 is provided between the conductive films 21 adjacent to each other in a stacked direction (Z-direction) of the stacked body ST_chip, electronically isolating the conductive films 21 from each other.

The stacked body ST_d as a first stacked body is provided on each dicing region Rd of the substrate 10. The stacked body ST_d is configured with the first insulating films 22 and second insulating films 23 alternately stacked, provided with no columnar portions CL. As for the second insulating films 23 each as a second material film, an insulative material such as a silicon nitride film is used, different from the first insulating films 22.

The interlayer insulating film 20 is provided between the stacked bodies ST_chip and the stacked body ST_d, to cover the periphery of the stacked body ST_d. As for the interlayer insulating film 20, for example, an insulative material such as a TEOS (TetraEthOxySilane) film, is used.

The passivation film 30 is provided on the stacked body ST_chip in each chip region Rchip. As for the passivation film 30, an insulative material, such as polyimide, is used.

The guard ring 40 is provided between the chip regions Rchip and the dicing region Rd, extending in the Z-direction from the topmost layers to the lowermost layers of the stacked bodies ST_chip and ST_d. The guard ring 40 protects the semiconductor elements in the chip regions Rchip so that a crack, which is generated when the dicing region Rd is cut, does not propagate to the chip regions Rchip. Therefore, the guard ring 40 is provided for the entire dicing region Rd so as to surround the entire periphery of the chip regions Rchip. As for the guard ring 40, for example, a single layer of a metal material, such as tungsten, copper, aluminum, titanium or tantalum, or a stacked layer of a plurality of these materials, is used.

The metal film 50 is provided on the stacked body ST_d and the interlayer insulating film 20 in the dicing region Rd. The metal film 50 functions as an alignment mark in device formation and a pad in the chip regions Rchip. As for the metal film 50, for example, a metal material, such as aluminum, is used.

Figure 3:
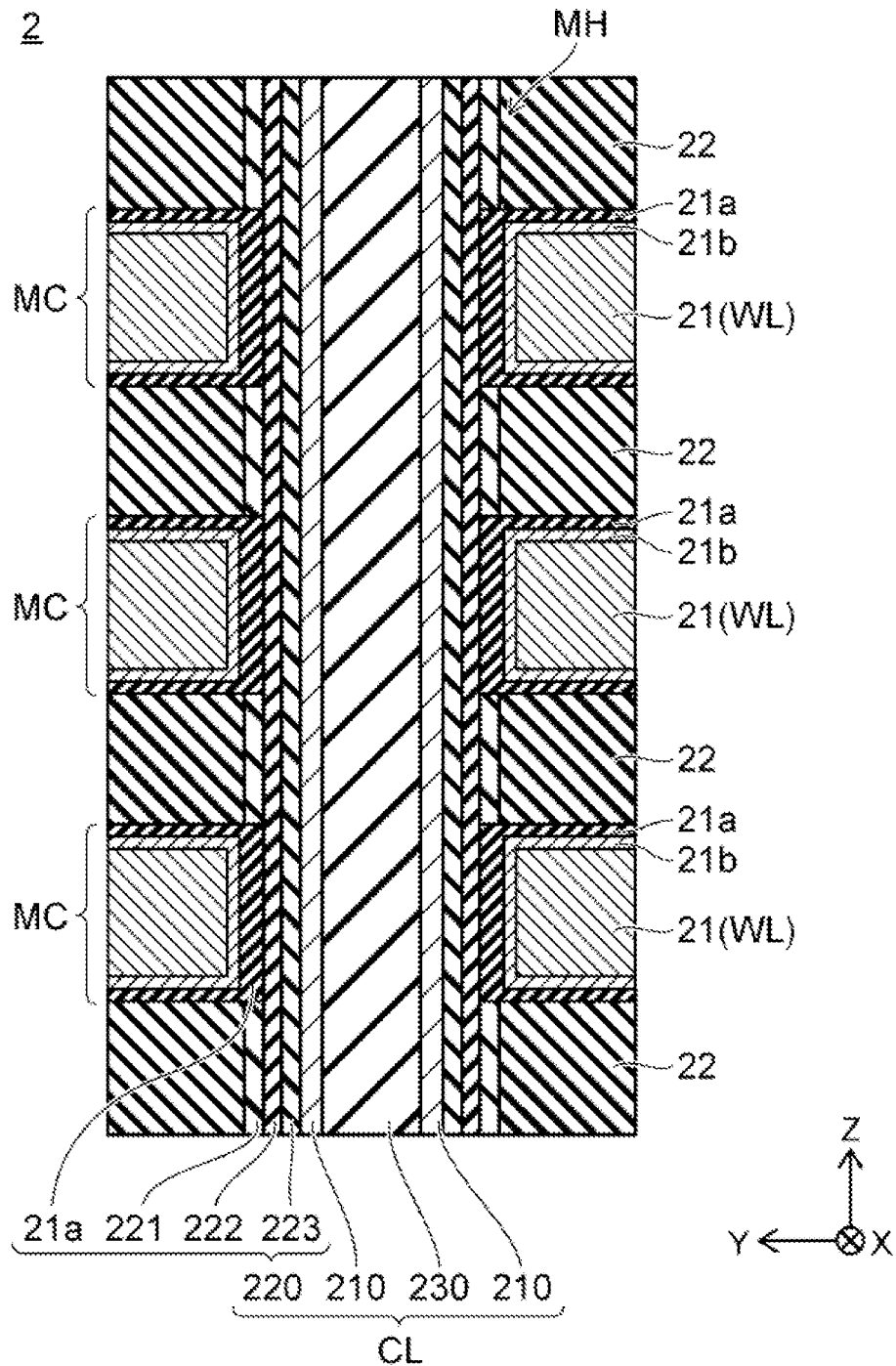
FIG. 3 is a schematic sectional view exemplifying a columnar portion CL.
Figure 4:
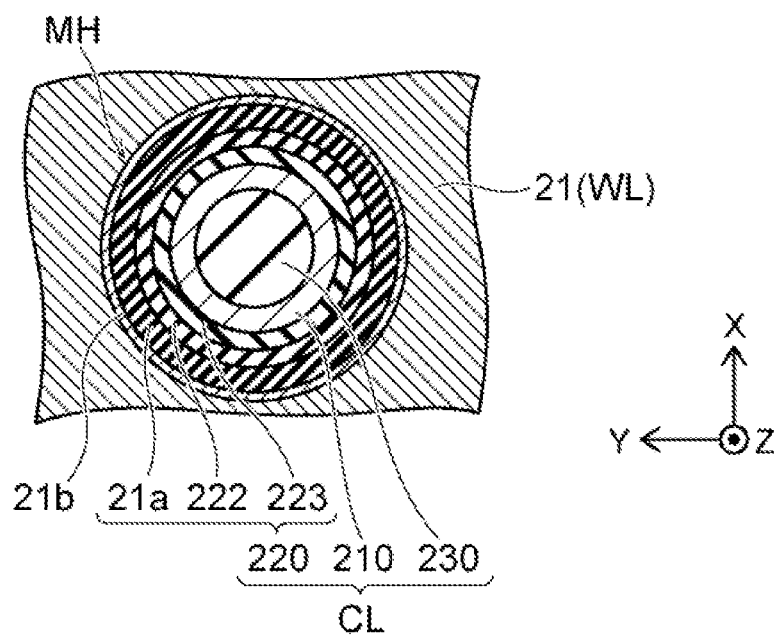
FIG. 4 is a schematic plan view showing an example of the columnar portion CL.
Figure 7:
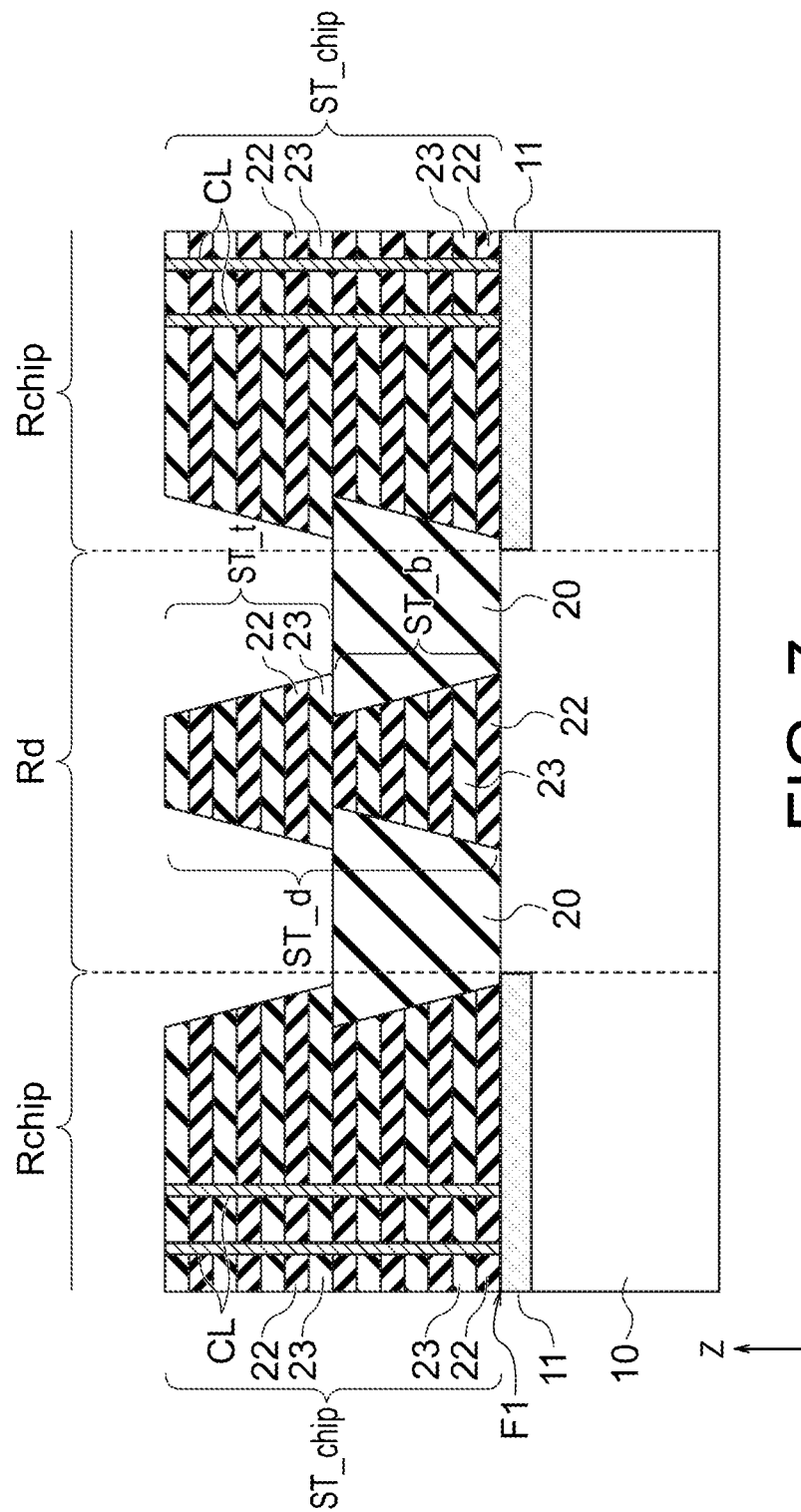

FIG. 3 is a schematic sectional view exemplifying each columnar portion CL. FIG. 4 is a schematic plan view exemplifying the columnar portion CL. A memory hole MH is provided penetrating the stacked body ST_chip in the Z-axis direction from the top of the stacked body ST_chip, and reaching an embedded source layer (31 in FIG. 22). Each of the plurality of columnar portions CL includes a semiconductor body 210, a memory film 220, and a core layer 230. The memory film 220 has a charge trap between the semiconductor body 210 and each conductive film 21. The plurality of columnar portions CL each one selected from each finger are connected together to one bit line BL. As shown in FIG. 7, each columnar portion CL is provided in the chip region Rchip.

As shown in FIG. 4, in the X-Y plane, the memory hole MH has a circular or an oval shape, for example. A blocking insulating film 21a, which is part of the memory film 220, may be provided between each conductive film 21 and the associated first insulating film 22. The blocking insulating film 21a is, for example, a silicon oxide film or a metal oxide film. One example of the metal oxide film is aluminum oxide. A barrier film 21b may be provided between each conductive film 21 and the associated first insulating film 22, and between the conductive film 21 and the memory film 220. As for the barrier film 21b, when the conductive film 21 is tungsten, for example, a stacked film of titanium nitride and titanium is selected. The blocking insulating film 21a restricts charge back-tunneling from the conductive film 21 to the memory film 220. The barrier film 21b enhances adhesiveness between the conductive film 21 and the blocking insulating film 21a.

The semiconductor body 210 has a tubular shape having a closed bottom, for example. The semiconductor body 210 contains silicon, for example, which is, for example, polysilicon that is crystallized amorphous silicon. The semiconductor body 210 is, for example, undoped silicon. Moreover, the semiconductor body 210 may be p-type silicon. The semiconductor body 210 functions as a channel of each of a drain-side transistor, a source-side transistor, and the memory cells MC.

The components of the memory film 220, except for the blocking insulating film 21a, are provided between the inner wall of the memory hole MH and the semiconductor body 210. The memory film 220 has a tubular shape, for example. A plurality of memory cells MC have a memory area between the semiconductor body 210 and each conductive film 21 that functions as a word line WL, stacked one another in the Z-axis direction. The memory film 220, for example, includes a cover insulating film 221, a charge trapping film 222, and a tunnel insulating film 223. Each of the semiconductor body 210, the charge trapping film 222, and the tunnel insulating film 223 extends in the Z-axis direction.

The cover insulating film 221 is provided between each insulating film 22 and the charge trapping film 222. The cover insulating film 221 contains silicon oxide, for example. The cover insulating film 221 protects the charge trapping film 222 so as not to be etched when replacing a sacrifice film (not shown) with each conductive film 21 (a replacement process). The cover insulating film 221 may be removed from between the conductive film 21 and the memory film 220 in the replacement process. In this case, as shown in FIGS. 3 and 4, for example, the blocking insulating film 21a is provided between each conductive film 21 and the charge trapping film 222. The cover insulating film 221 is not needed when the replacement process is not used in formation of the conductive films 21.

The charge trapping film 222 is provided between the blocking insulating film 21a and cover insulating film 221, and the tunnel insulating film 223. The charge trapping film 222, for example, contains silicon nitride, having a trap cite for trapping charges inside its film. Of the charge trapping film 222, the portion interposed between each conductive film 21 functioning as a word line WL and the semiconductor body 210 forms a memory area of the memory cell MC a charge trap. The threshold voltage of the memory cell MC varies depending on whether there are charges in the charge trap or the amount of charges trapped in the charge trap. Accordingly, the memory cell MC can hold information.

The tunnel insulating film 223 is provided between the semiconductor body 210 and the charge trapping film 222. The tunnel insulating film 223, for example, contains silicon oxide, or silicon oxide and silicon nitride. The tunnel insulating film 223 is a potential barrier between the semiconductor body 210 and the charge trapping film 222. For example, when injecting electrons from the semiconductor body 210 to the charge trap (a write operation), and when injecting holes from the semiconductor body 210 to the charge trap (an erase operation), the electrons and holes pass through (tunneling) the potential barrier.

The core layer 230 is embedded in the inner space of the tubular semiconductor body 210. The core layer 230 has a columnar shape, for example. The core layer 230, for example, contains silicon oxide and hence is insulative.

As described above, the semiconductor wafer W according to the present embodiment has the control circuit 11 and the stacked body ST_chip (memory cell array) in each chip region Rchip, and the stacked body ST_d in each dicing region Rd. The stacked body ST_d in each dicing region Rd is provided along the entire periphery of the dicing region Rd so as to surround the entire periphery of each chip region Rchip in the planer layout of FIG. 1.

As shown in FIG. 2, the stacked body ST_d is provided in the entire material film (interlayer insulating film 20) from top to bottom in the Z-direction. Because of the stacked body ST_d remaining in the dicing region Rd, a cleavage from a modified portion inside the substrate 10 spreads along the stacked body ST_d or the interface between the stacked body ST_d and the interlayer insulating film 20. Therefore, a division line in the dicing region Rd is formed along the stacked body ST_d, having linearity maintained without largely deviating from the stacked body ST_d. In other words, the cleavage spreads in the thickness direction of the semiconductor wafer W in the Z-direction, having linearity maintained, and also spreads in the X-Y plane of the semiconductor wafer W, having linearity maintained. As a result, meandering of the division line to the chip region Rchip can be restricted, so that a crack of a semiconductor chip can be restricted.

The stacked body ST_d in the dicing region Rd is formed by being separated into a lower stacked body ST_b and an upper stacked body ST_t. The lower stacked body ST_b is located closer to the substrate 10 than the upper stacked body ST_t. Both of the lower stacked body ST_b and the upper stacked body ST_t have a tapered side face in cross section in the orthogonal direction to the extending direction of the dicing region Rd. The side faces of the lower stacked body ST_b and the upper stacked body ST_t each have a narrower width in the upward stacking direction (from the lower layer to the upper layer). The "width" here means a width in a roughly orthogonal direction (X- or Y-direction) to the stacking direction of the stacked body ST_d.

Although the stacked body ST_chip in each chip region Rchip is different from the stacked body ST_d in plane layout, the stacked body ST_chip and the stacked body ST_d are the same as each other in terms of being separated into the lower stacked body and the upper stacked body. Moreover, the lower stacked body and the upper stacked body of the stacked body ST_chip have the same tapered side face as the lower stacked body ST_b and the upper stacked body ST_t of the stacked body ST_d, respectively. Accordingly, although different in plane layout, the stacked body ST_d has the same stacked configuration as the stacked body ST_chip. This is because the stacked bodies ST_d and ST_chip are simultaneously formed. By forming the stacked bodies ST_d and ST_chip simultaneously, the manufacturing process can be shortened.

The stacked bodies ST_chip and ST_d are formed as a stacked body of the first insulating films 22 (for example, a silicon oxide film) and the second insulating films 23 (for example, a silicon nitride film) in an early stage of the manufacturing process. In other words, the stacked bodies ST_chip and ST_d are formed with the same material in the early stage. However, thereafter, the second insulating films 23 of the stacked body ST_chip are replaced with the conductive films 21 (for example, tungsten) that function as word lines WL. Therefore, in a finished product, the stacked body ST_chip and the stacked body ST_d may be of different materials. Nevertheless, the second insulating films 23 of the stacked body ST_d may also be replaced with the conductive films 21 (for example, tungsten), in the same manner as the second insulating films 23 of the stacked body ST_chip. In this case, although the stacked body ST_chip and the stacked body ST_d are different in plane layout, they are the same as each other in stacked structure in the Z-direction, material, etc.

Subsequently, a manufacturing method of a semiconductor wafer according to the present embodiment will be explained.

FIGS. 5 to 10 are sectional views showing an example of a manufacturing method of the semiconductor wafer W according to the first embodiment. First of all, each control circuit 11 is formed on the front surface F1 of the substrate 10. The control circuit 11 is, for example, a CMOS circuit configured with transistors and the like. The control circuit 11 is covered with an interlayer insulating film (not shown) which is then flattened.

Figure 5:
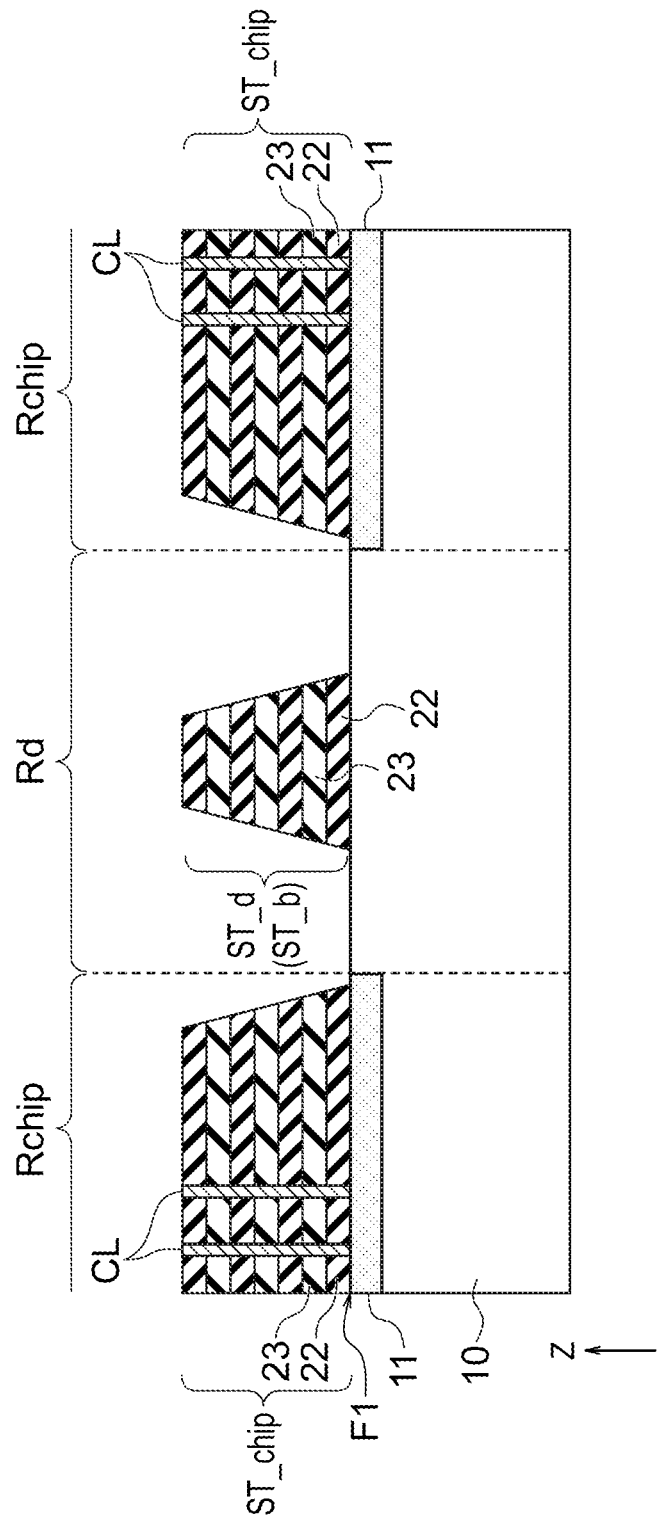
FIGS. 5 to 10 are sectional views showing an example of a manufacturing method of the semiconductor wafer according to the first embodiment.

Subsequently, over the control circuit 11, the first insulating films 22 and the second insulating films 23 are alternately stacked. As for the first insulating films 22, for example, a silicon oxide is used. As for the second insulating films 23, for example, silicon nitride is used. Accordingly, as shown in FIG. 5, a lower portion of the stacked body ST_chip is formed in each chip region Rchip and the lower stacked body ST_b is formed in the dicing region Rd. At this time, if the stacked body ST_chip includes a larger number of first insulating films 22 and second insulating films 23, the memory holes have a higher aspect ratio. Therefore, the memory holes and the columnar portions CL are formed separately in the lower and upper portions of the stacked body ST_chip in a plurality of times. Since the stacked body ST_d is formed simultaneously with the stacked body ST_chip, the stacked body ST_d is also formed into a lower stacked body ST_b and an upper stacked body ST_t separately in a plurality of times. In FIG. 5, the memory holes are formed at the lower portion of the stacked body ST_chip, so that the lower portions of the columnar portions CL are formed.

Subsequently, using lithography and etching techniques, memory holes are formed in order to form the columnar portions CL in each stacked body ST_chip. At the time of or after the formation of memory holes, using lithography and etching techniques, the first insulating films 22 and the second insulating films 23 between the stacked body ST_d and the stacked body ST_chip are removed to separate the stacked body ST_d and the stacked body ST_chip therebetween. In this way, the structure shown in FIG. 5 is obtained.

Figure 6:
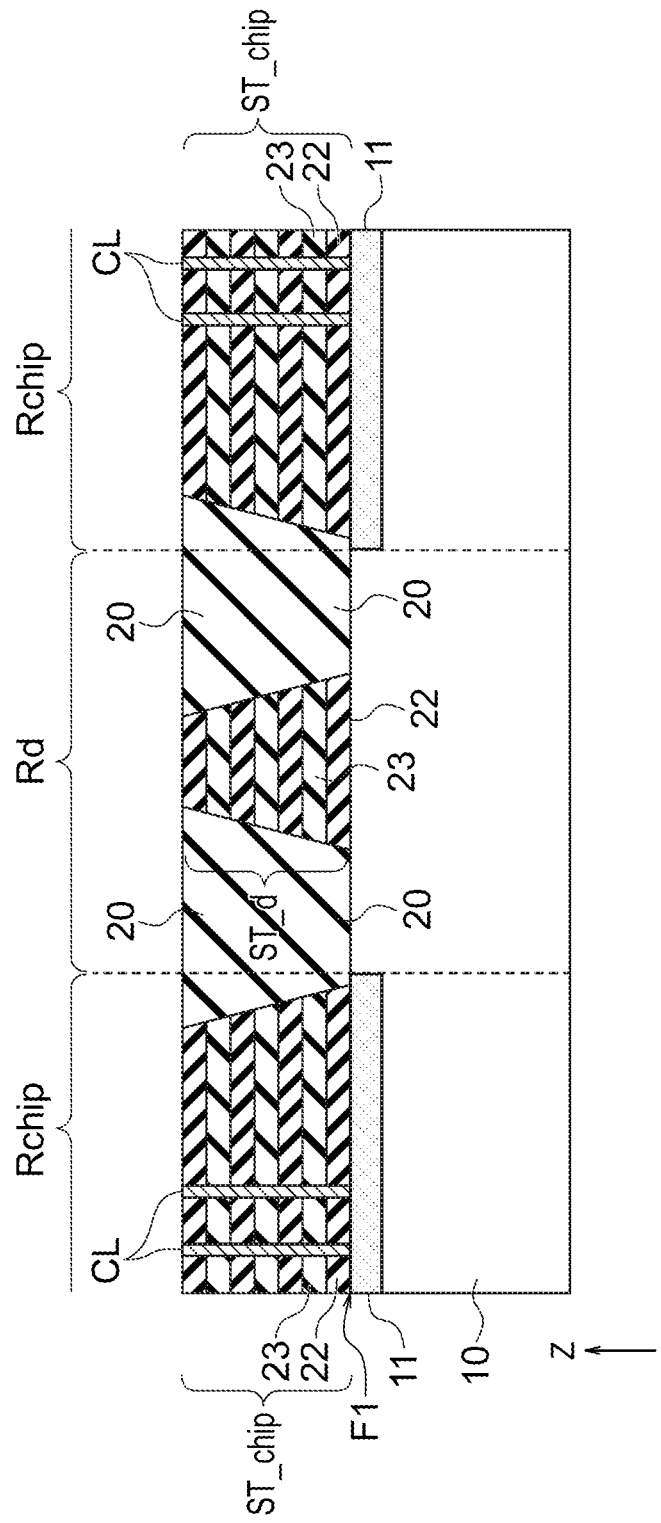

Subsequently, the interlayer insulating film 20 is deposited on the stacked body ST_d and the stacked bodies ST_chip. As for the interlayer insulating film 20, for example, an insulating film such as a TEOS film is used. Subsequently, the interlayer insulating film 20 is flattened until the upper surfaces of the stacked body ST_d and the stacked bodies ST_chip are exposed. The interlayer insulating film 20 remains in the grooves between the stacked body ST_d and the stacked bodies ST_chip. In this way, the structure shown in FIG. 6 is obtained.

Subsequently, on the lower portions of each stacked body ST_chip and of the stacked body ST_d, the first insulating films 22 and the second insulating films 23 are further formed alternately. In this way, as shown in FIG. 7, the upper portion of the stacked body ST_chip is formed in each chip region Rchip and the upper stacked body ST_t is formed in the dicing region Rd.

Subsequently, using lithography and etching techniques, memory holes are formed in order to form the columnar portions CL on the upper portion of each stacked body ST_chip. Moreover, the upper portions of the columnar portions CL are formed inside the memory holes.

At the time of or after the formation of memory holes, using lithography and etching techniques, the first insulating films 22 and the second insulating films 23 between the upper portion of the stacked body ST_d and the upper portions of the stacked bodies ST_chip are removed to separate the stacked body ST_d and the stacked bodies ST_chip therebetween. In this way, the structure shown in FIG. 7 is obtained.

Figure 8:
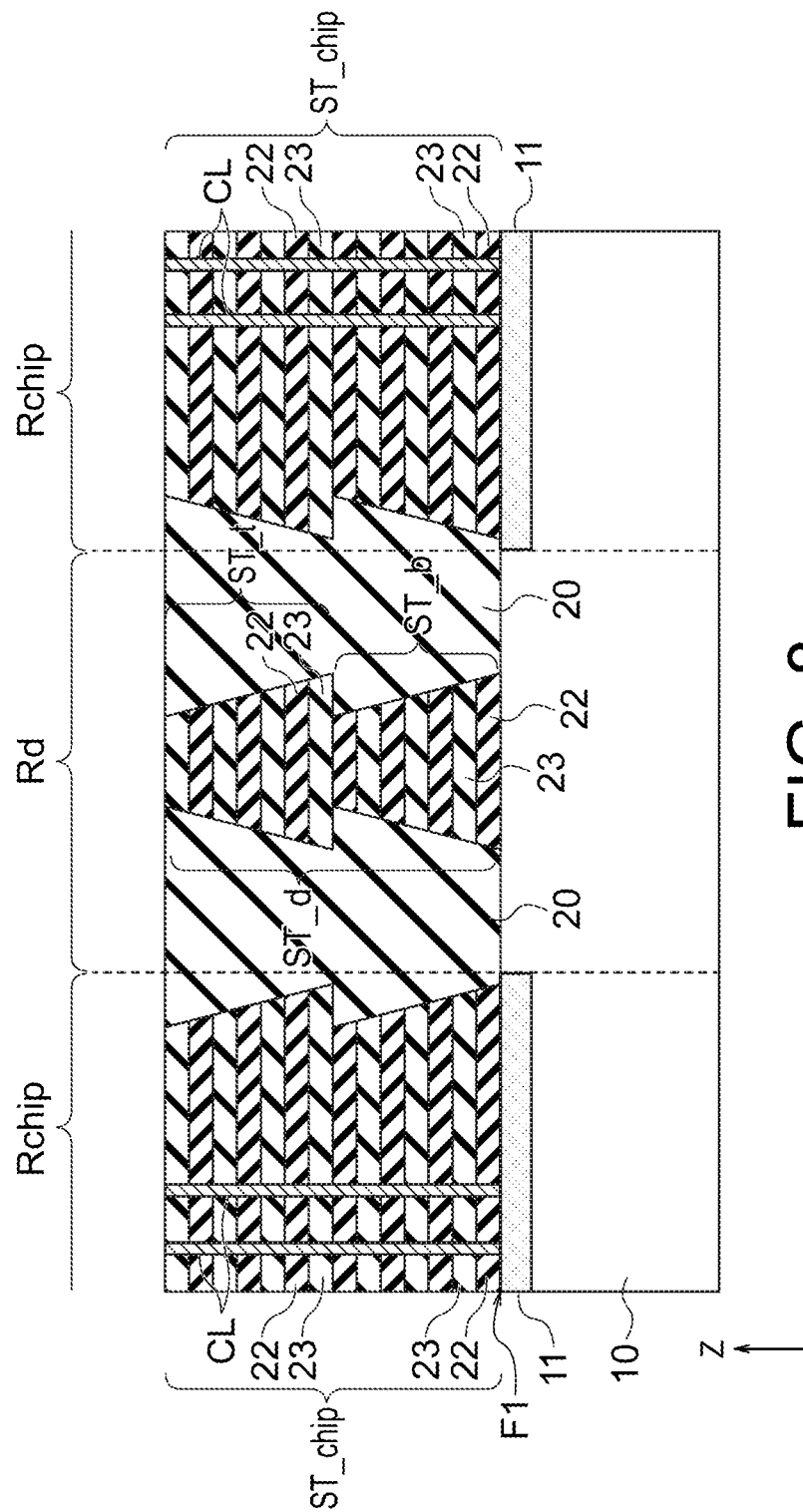

Subsequently, the interlayer insulating film 20 is deposited on the stacked body ST_d and the stacked bodies ST_chip. Subsequently, the interlayer insulating film 20 is flattened until the upper surfaces of the stacked body ST_d and the stacked bodies ST_chip are exposed. The interlayer insulating film 20 remains in the grooves between the stacked body ST_d and the stacked bodies ST_chip. In this way, the structure shown in FIG. 8 is obtained.

Figure 9:
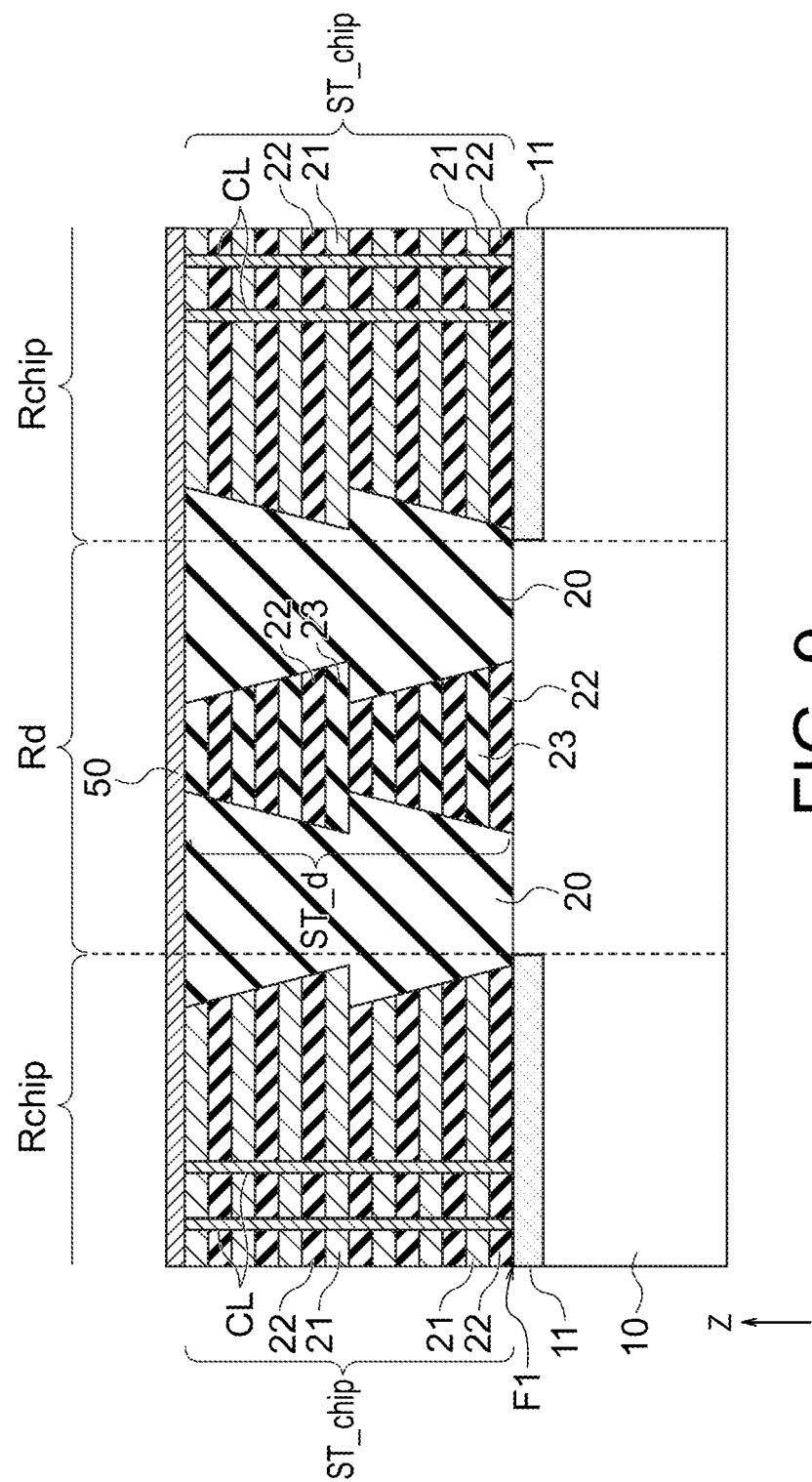
Figure 10:
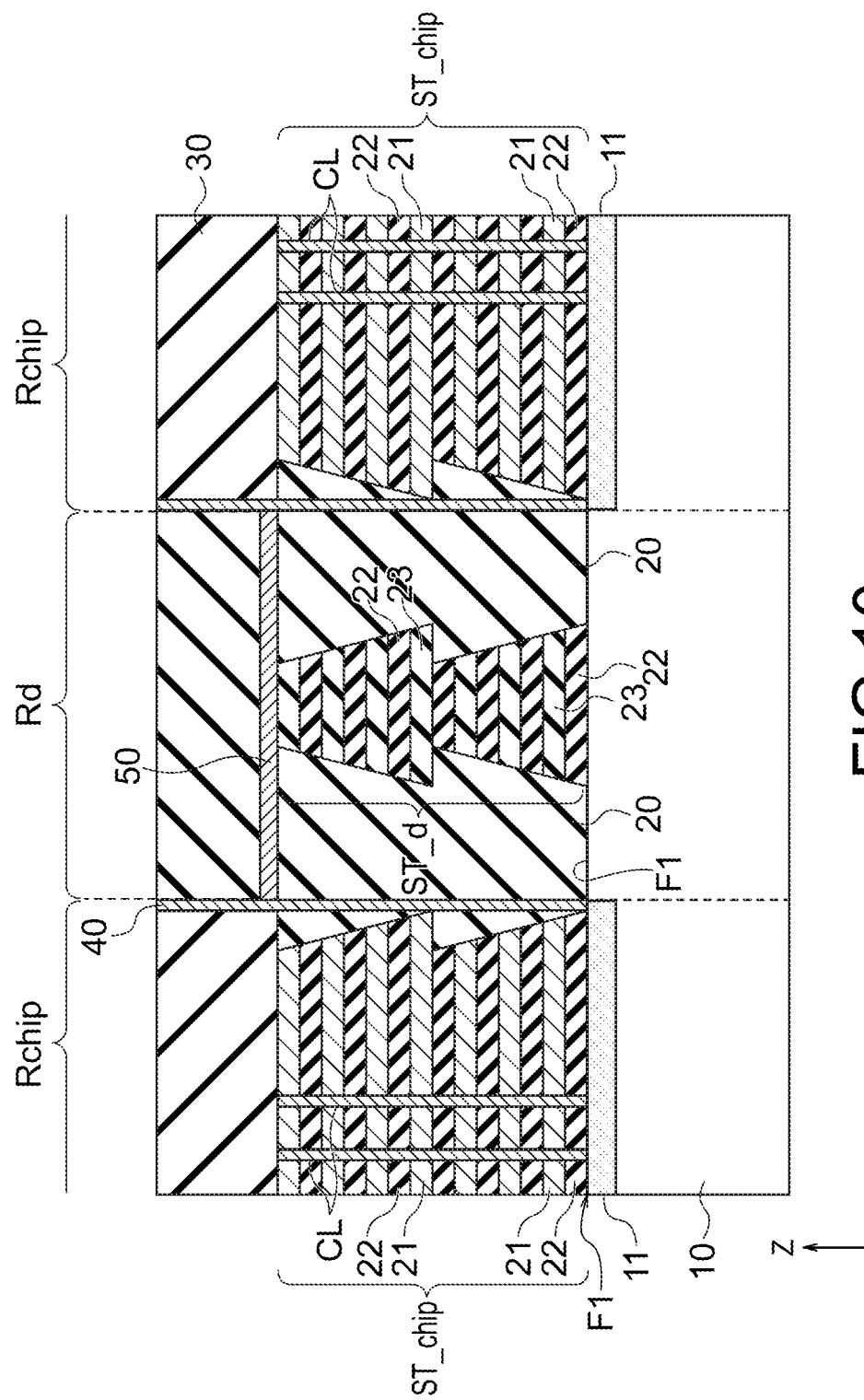

Subsequently, slits (not shown) are formed and then, through the slits, as shown in FIG. 9, the second insulating films 23 are replaced with the conductive films 21. As for the conductive films 21, for example, conductive metal such as tungsten is used. The conductive films 21 function as word lines WL. Subsequently, the metal film 50 is deposited on the stacked body ST_d and the stacked bodies ST_chip. As for the metal film 50, for example, metal such as aluminum is used. The metal film 50 functions as an alignment mark and a pad. The alignment mark is used for positioning in a lithography process and the like. The pad is bonded by wire ponding in an assembly process, to be used for electrical connection of a semiconductor package to outside.

Subsequently, using lithography and etching techniques, the metal film 50 is processed so that the metal film 50 in each chip region Rchip is removed whereas the metal film 50 in the dicing region Rd remains. At this time, the conductive films 21 in the stacked body ST_chip also remain.

Subsequently, the passivation film 30 is formed on the stacked bodies ST_chip and ST_d. As for the passivation film 30, for example, an insulating film, such as polyimide, is used. Subsequently, the guard ring 40 is formed between each chip region Rchip and the dicing region Rd. As for the guard ring 40, for example, a single layer of a metal material, such as tungsten, copper, aluminum, titanium or tantalum, or a stacked layer of a plurality of these materials, is used.

Subsequently, the passivation film 30 in the dicing region Rd is removed. In this way, the semiconductor wafer W shown in FIG. 2 is obtained.

Subsequently, the dicing process will be explained.

Figure 11:
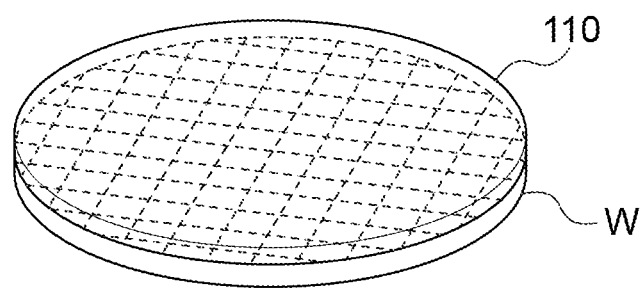
FIG. 11 is a perspective view showing an example of a dicing method of the semiconductor wafer according to the first embodiment.

FIGS. 11 to 17 are perspective views or sectional views showing an example of a dicing method of the semiconductor wafer W according to the first embodiment. At first, as shown in FIG. 11, a protective tape 110 for dicing is stuck on the front surface of the semiconductor wafer W.

Figure 12:
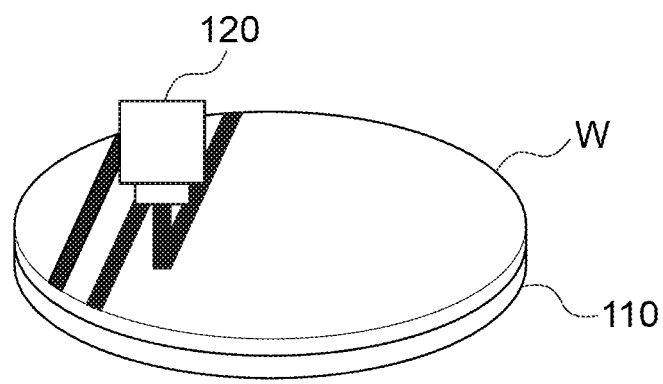
FIG. 12 is a perspective view showing the dicing method, following to FIG. 11.
Figure 13:
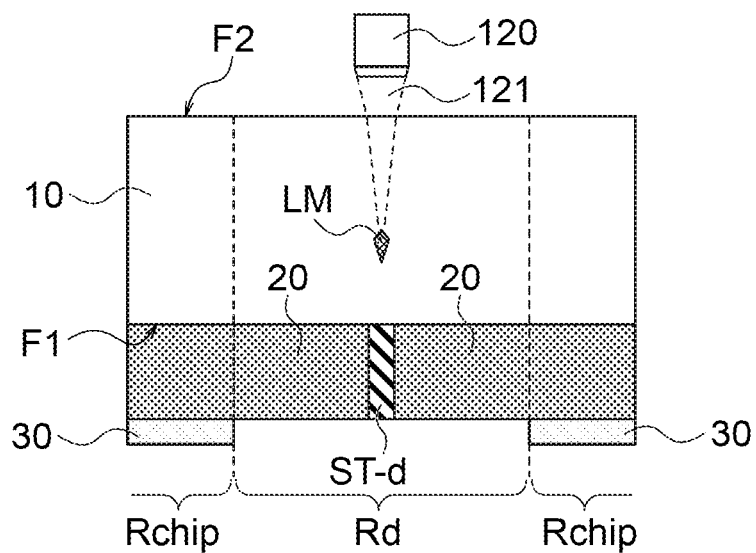
FIG. 13 is a sectional view showing the dicing method, following to FIG. 11.

Subsequently, as shown in FIGS. 12 and 13, using a laser oscillator 120, a laser beam 121 is emitted to the portions which correspond to the dicing regions Rd from the rear surface (a second face) F2 of the semiconductor wafer W. In this way, as shown in FIG. 13, a modified layer LM is formed inside the semiconductor wafer W. Although the modified layer LM may be formed inside the semiconductor wafer W in each dicing region R, it is preferably be formed just under or in the vicinity of the stacked body ST_d. In FIG. 13 and the following figures, the configuration of the semiconductor wafer W is schematically shown, with no illustration of the stacked bodies ST_chip.

Figure 14:
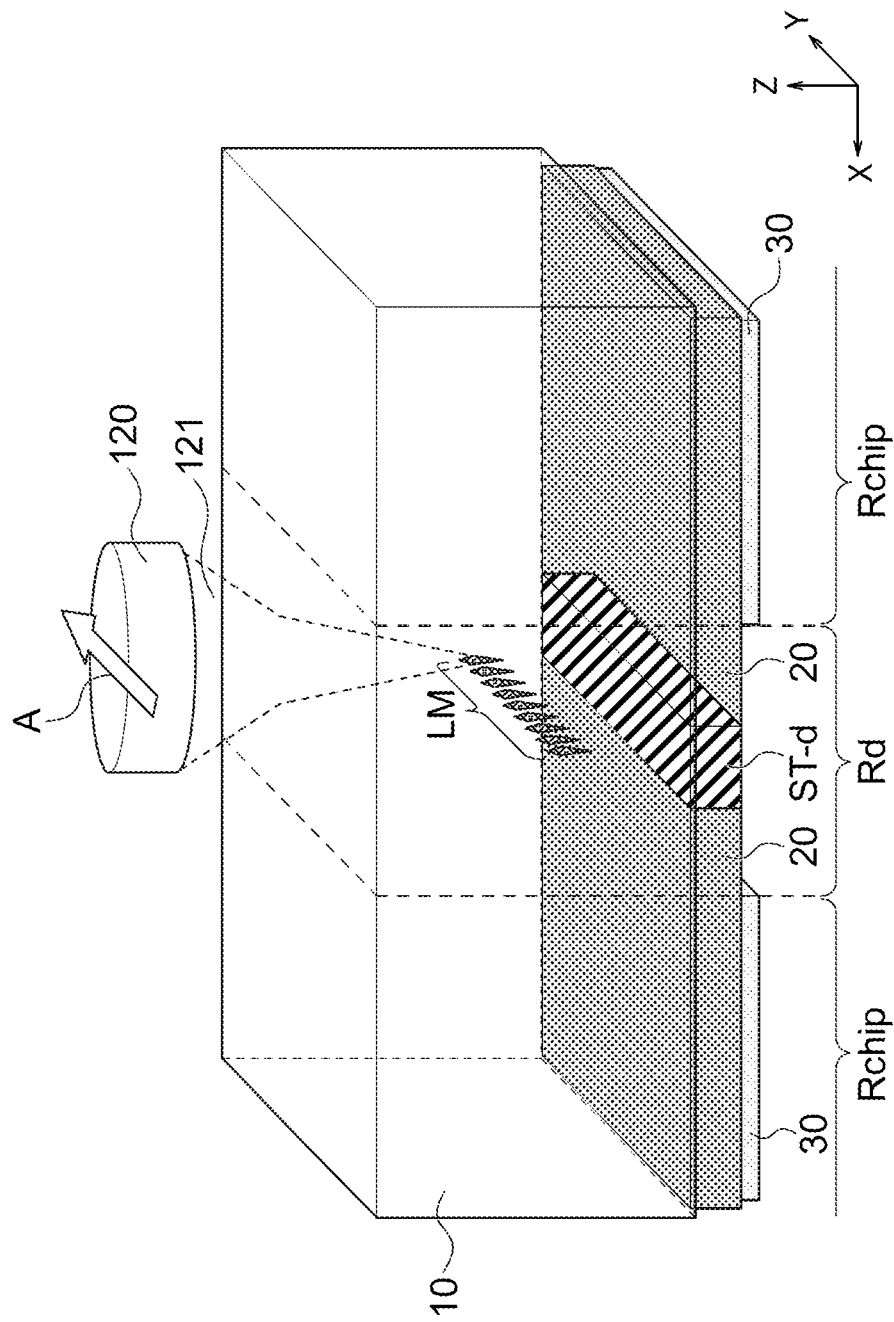
FIG. 14 is a sectional view showing the dicing method, following to FIG. 11.

FIG. 14 is a perspective view showing the state of emitting the laser beam 121. The laser oscillator 120, while moving in a Y-direction as shown by an arrow A, emits the laser beam 121 in the form of pulses. In this way, modified layers LM are formed intermittently in the Y-direction and formed roughly in parallel along the dicing region Rd. Although being formed intermittently, the modified layers LM are connected in the Y-direction roughly in the form of a layer. The modified layers LM may be in the form of a single layer or a plurality of layers formed at different positions (heights) in a Z-direction.

Figure 15:
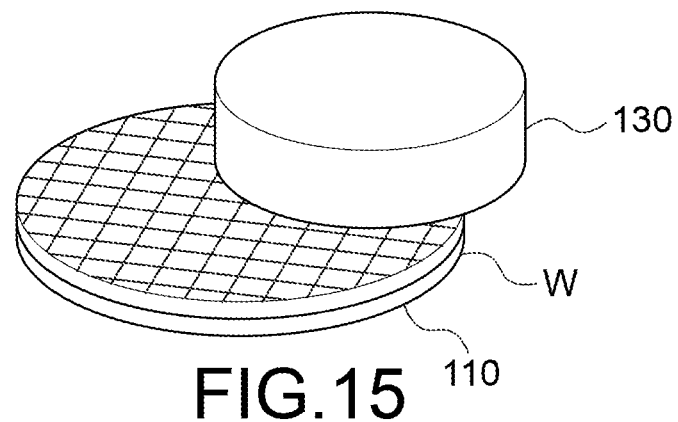
FIG. 15 is a perspective view showing the dicing method, following to FIG. 12.
Figure 16:
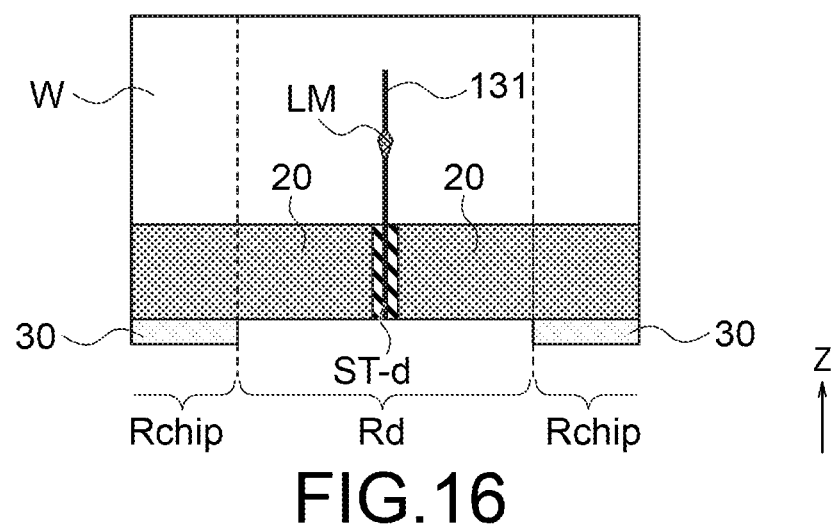
FIG. 16 is a sectional view showing the dicing method, following to FIG. 12.

Subsequently, as shown in FIG. 15, the semiconductor wafer W is grinded and/or polished at the rear surface F2. Being polished with a sharpening stone 130, the semiconductor wafer W is thinned, and not only that, as shown in FIG. 16, a cleavage spreads in the Z-direction from each modified layer LM.

The stacked body ST_d is provided in the interlayer insulating film 20 in the dicing region Rd. Having the stacked body ST_d remaining in the dicing region Rd, when a cleavage from the modified layer LM in the substrate 10 reaches the stacked body ST_d, the cleavage spreads along the stacked body ST_d or the interface between the stacked body ST_d and the interlayer insulating film 20. The stacked body ST_d induces the cleavage in the dicing region Rd.

Therefore, a division line in the dicing region Rd is formed along the stacked body ST_d, without largely deviating from the stacked body ST_d. As a result, a crack can be restricted from reaching the chip region Rchip, so that a crack of a semiconductor chip can be restricted.

Figure 17:
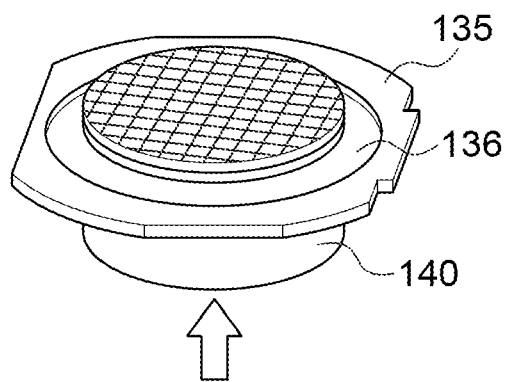
FIG. 17 is a perspective view showing the dicing method, following to FIG. 15.

Subsequently, the rear surface F2 of the semiconductor wafer W is stuck on a dicing tape 136 having an adhesive layer and then the dicing tape 136 is fixed with a ring 135. Subsequently, as shown in FIG. 17, the dicing tape 136 is pushed up with a push-up member 140 to be pulled (expanded). In this way, together with the dicing tape 136, the semiconductor wafer W is pulled outwardly. At this time, the semiconductor wafer W is cleaved along the modified layers LM (in other words, along the dicing lines), to be chipped or individualized into a plurality of semiconductor chips.

In the above example, the semiconductor wafer W is polished at its rear surface F2 after being irradiated with a laser beam. However, the semiconductor wafer W may be irradiated with a laser beam after being polished at its rear surface F2.

Figure 18:
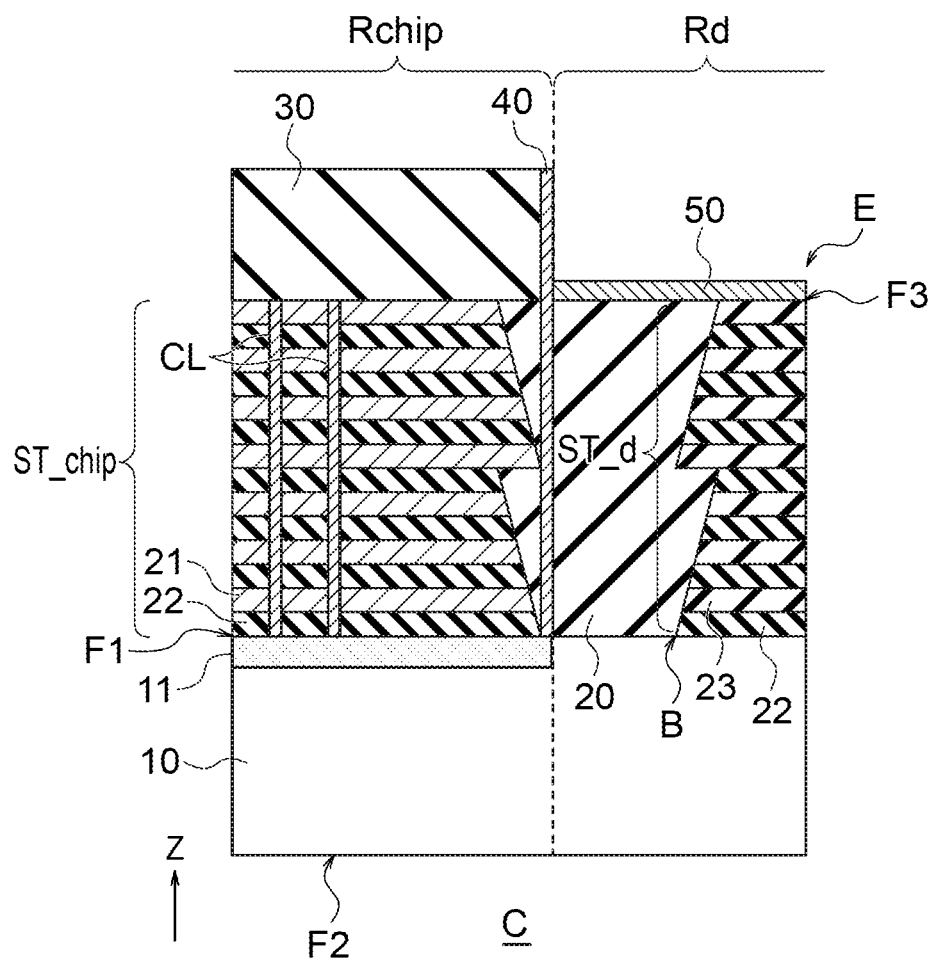
FIG. 18 is a sectional view showing an end of a semiconductor chip according to the first embodiment.

FIG. 18 is a sectional view showing an end of a semiconductor chip according to the first embodiment. A semiconductor chip C is provided with the substrate 10, the control circuit 11, the stacked bodies ST_chip and ST_d, the interlayer insulating film 20, the passivation film 30, the guard ring 40, and the metal film 50, in the same manner as explained with reference to FIG. 2. However, since the semiconductor chip C is a piece chipped from the semiconductor wafer W, the semiconductor chip C has been cleaved in the dicing region Rd.

The semiconductor chip C has a first face F1, a second face F2 located opposite to the first face F1, and a side face F3 located between the first face F1 and the second face F2. A semiconductor element (such as CMOS) that forms the control circuit 11 is provided on the first face F1.

Since the semiconductor chip C has been cleaved in the dicing region Rd, the dicing region Rd, as a division region, is located at an outer edge E of the first face F1. At the outer edge E, the side face F3 has a modified layer LM and a cleaved surface in the dicing process. The stacked body ST_d that is configured by alternately stacking the first insulating films 22 and the second insulating films 23 remains in the dicing region Rd. Therefore, the stacked body ST_d divided by cleavage appears on the side face F3.

The stacked body ST_d may remain at the entire outer edge of the first face F1 of the semiconductor chip C. In this case, the stacked body ST_d is provided so as to surround the semiconductor chip C along the side face F3. However, depending on the cleavage in the dicing region Rd, a cleavage occurs on a border B between the interlayer insulating film 20 and the stacked body ST_d, so that the stacked body ST_d may not remain on the side face F3. Therefore, it is enough for the stacked body ST_d to appear on at least part of the side face F3.

The other configurations of the semiconductor chip C may be the same as the corresponding configurations of the semiconductor wafer W. Accordingly, also in the semiconductor chip C, the effects of the present embodiment can be obtained.

Modification Example 1

Figure 19:
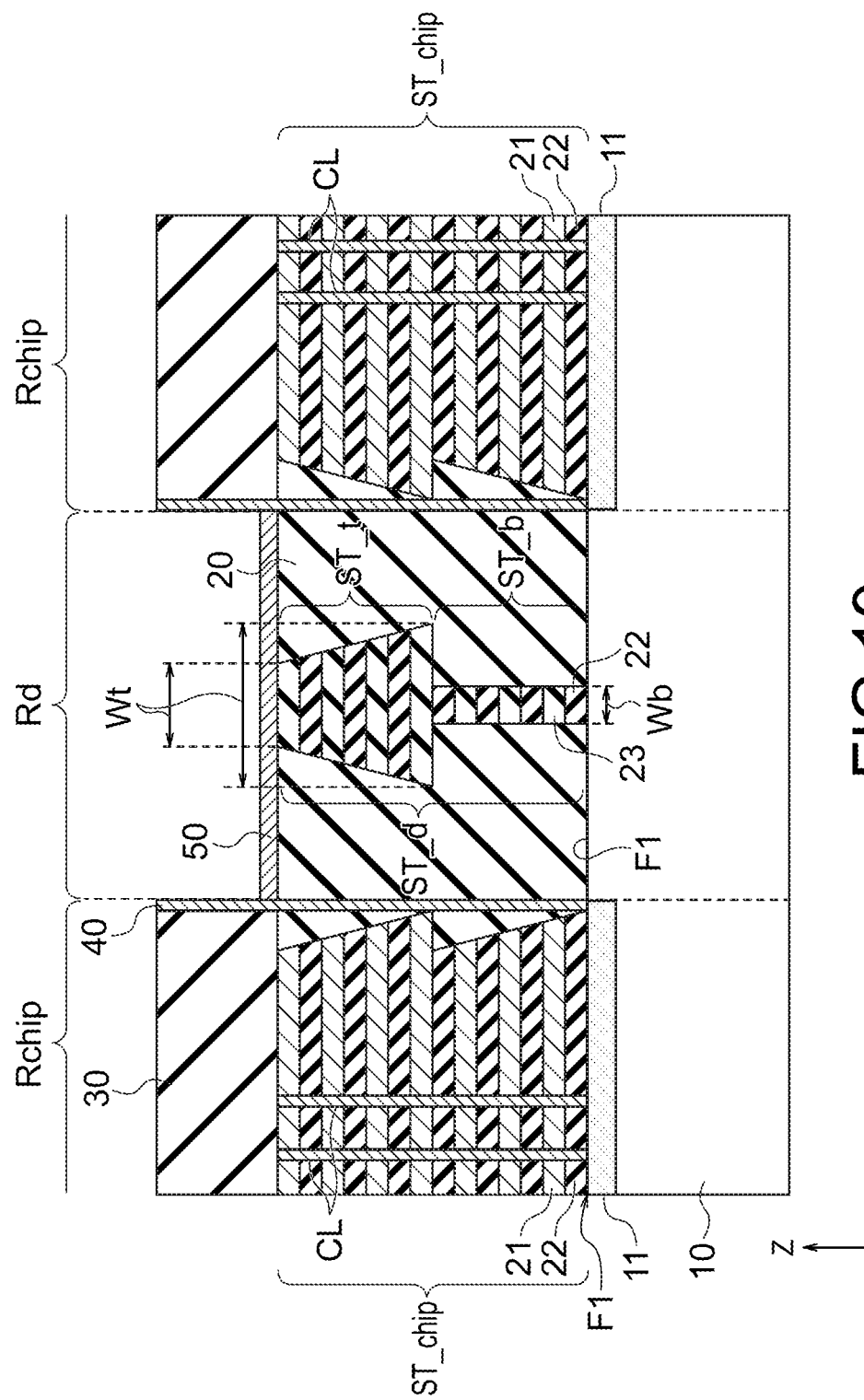
FIG. 19 is a sectional view showing a configuration example of a semiconductor wafer in accordance with a modification example 1 of the first embodiment.

FIG. 19 is a sectional view showing a configuration example of a semiconductor wafer in accordance with a modification example 1 of the first embodiment. In the modification example 1, the lower stacked body ST_b has a sectional shape different from that of the first embodiment. In a section orthogonal to the extending direction of the dicing region Rd, the lower stacked body ST_b has a first width Wb (a width in a roughly orthogonal direction to the Z-direction). The first insulating films 22 and the second insulating films 23 are formed having a roughly same first width Wb.

The upper stacked body ST_t has the same sectional shape as that of the first embodiment. In other words, in a section in the orthogonal direction to the extending direction of the dicing region Rd, the upper stacked body ST_t has a second width Wt (a width in a roughly orthogonal direction to the Z-direction) that is larger than the first width Wb. The stacked body ST_d has a mushroom-like shape entirely.

As described above, even though part of the stacked body ST_d is different in shape, as long as the stacked body ST_d is provided entirely in the Z-direction of the interlayer insulating film 20, the effects of the present embodiment can be obtained.

The lower stacked body ST_b may be formed in a different process from that for the stacked bodies ST_chip. In this case, a lithography process, an etching process and a deposition process for the insulating films 22 and 23 are added. It is a matter of course that the upper stacked body ST_t may also be formed in a different process from that for the stacked bodies ST_chip. In this case, the stacked body ST_d is formed having a roughly same width (the first width Wb or the second width Wt) entirely.

Modification Example 2

Figure 20:
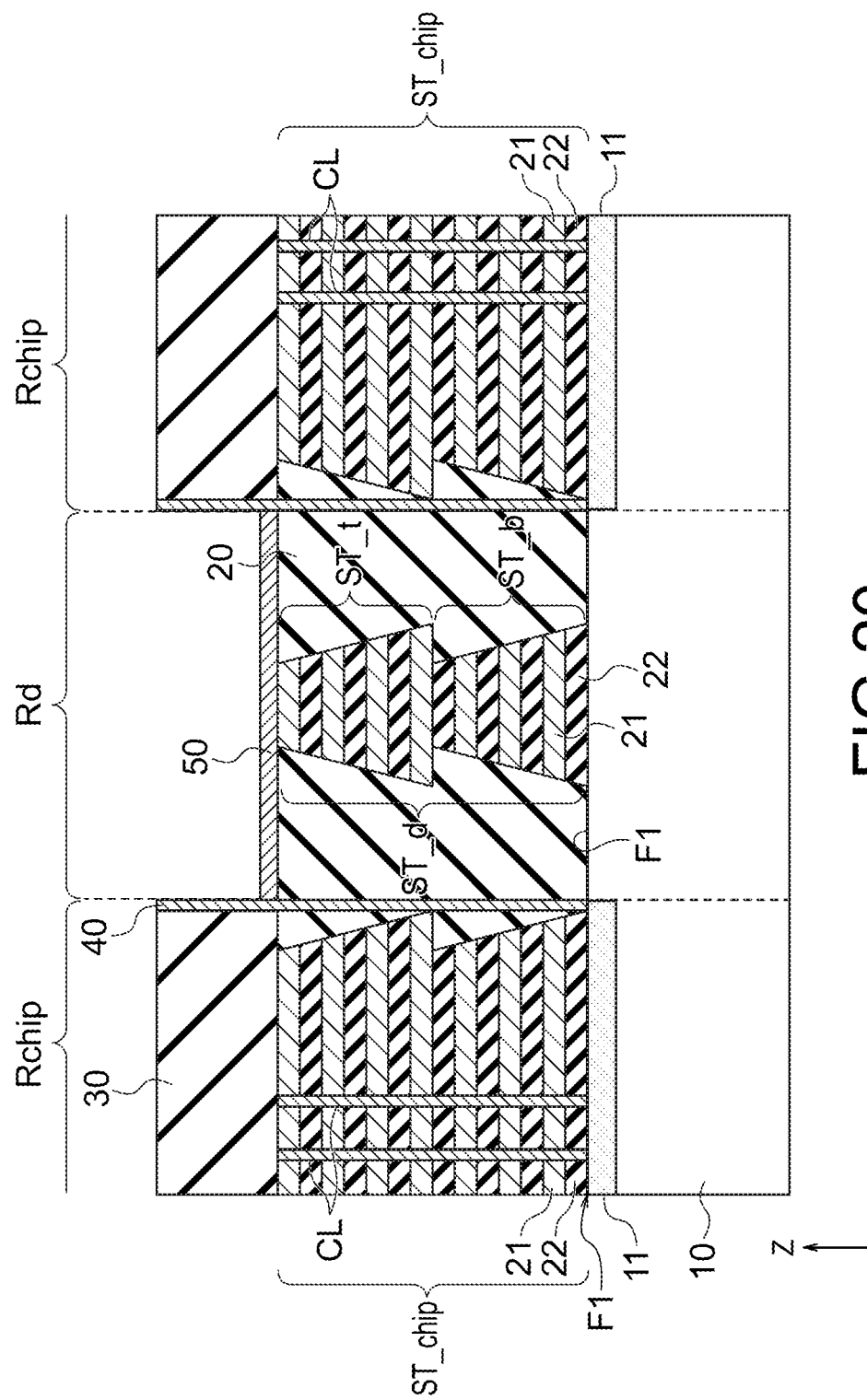
FIG. 20 is a sectional view showing a configuration example of a semiconductor wafer in accordance with a modification example 2 of the first embodiment.

FIG. 20 is a sectional view showing a configuration example of a semiconductor wafer in accordance with a modification example 2 of the first embodiment. In the modification example 2, the second insulating films 23 of the stacked body ST_d are replaced with the conductive films 21. In other words, the material of the stacked body ST_d is the same material as the stacked bodies ST_chip (for example, tungsten). The second insulating films 23 of the stacked body ST_d are replaced at the same time as the replacement of the second insulating films 23 of the stacked bodies ST_chip with the conductive films 21. The other configurations of the modification example 2 may be the same as the corresponding configurations of the first embodiment.

As described above, even though the stacked body ST_d has the conductive films 21 in place of the second insulating films 23, a cleavage from the modified layer LM can be induced. Therefore, the modification example 2 can obtain the same effects as the first embodiment. Moreover, the modification example 2 may be combined with the first embodiment.

Figure 21:
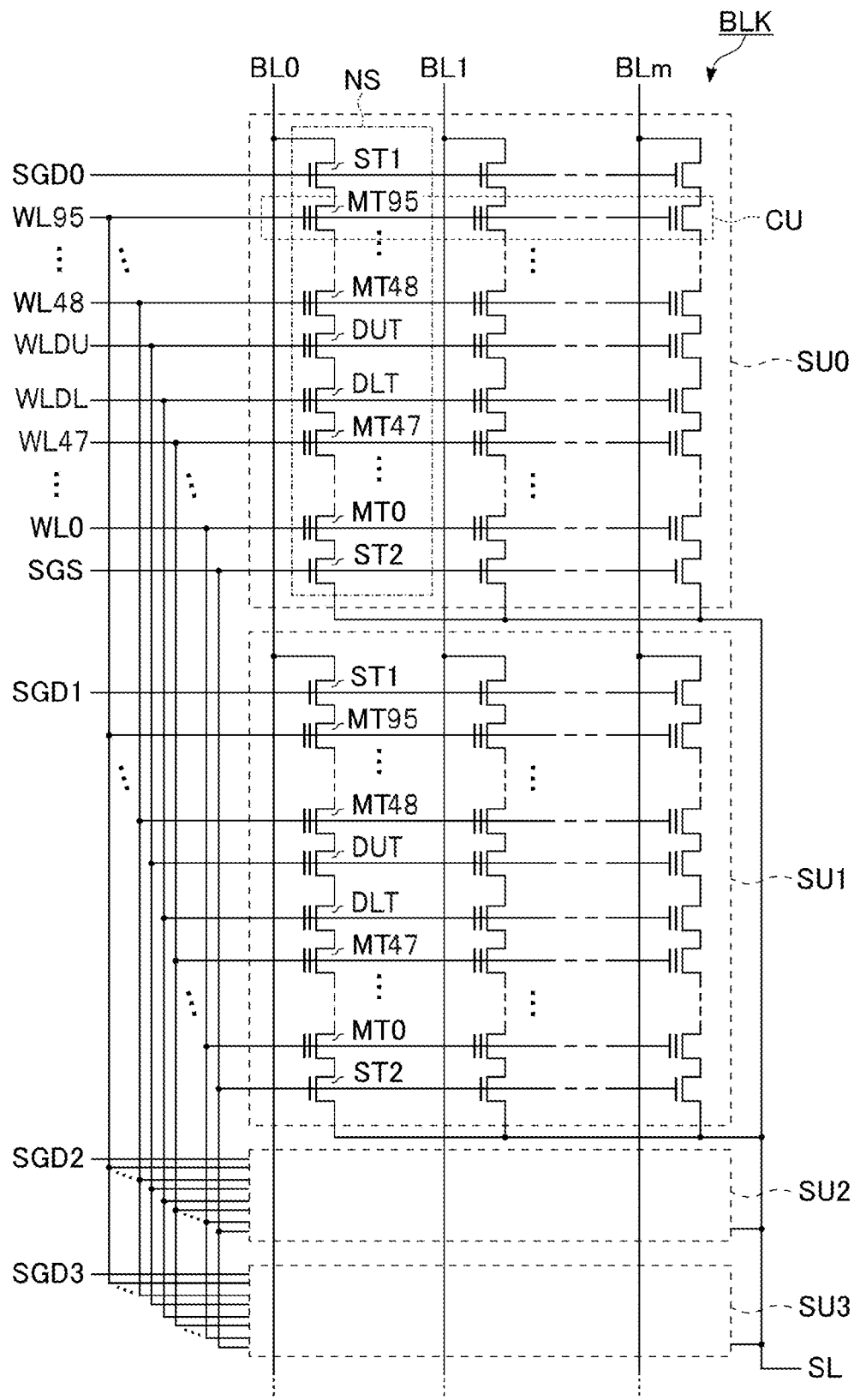
FIG. 21 is a circuit diagram showing an example of the circuit configuration of a memory cell array of NAND flash memories, which is a semiconductor storage device using the present embodiment.

FIG. 21 is a circuit diagram showing an example of the circuit configuration of a memory cell array of NAND flash memories, which is a semiconductor storage device using the above embodiment. The memory cell array includes a plurality of blocks BLK. Each block BLK includes, for example, four string units SU0, SU1, SU2, and SU3. Hereinafter, when denoted as a string unit SU, it indicates each of the string units SU0 to SU3.

Each string unit SU includes a plurality of NAND strings NS which are associated with bit lines BL0, BL1, . . . , and BLm (m being an integer of 0 or a larger number), respectively. Hereinafter, when denoted as a bit line BL, it indicates each of the bit lines BL0 to BLm. Each NAND string NS includes, for example, memory cell transistors MT0, MT1, MT2, . . . , and MT47, dummy transistors DLT and DUT, memory cell transistors MT48, MT49, MT50, . . . , and MT95, and selection gate transistors ST1 and ST2. Hereinafter, when denoted as a memory cell transistor MT, it indicates each of the memory cell transistors MT0 to MT95.

The memory cell transistor MT includes a control gate and a charge storage layer, to store data in a non-volatile manner. The dummy transistors DLT and DUT each, for example, have the same configuration as the memory cell transistor MT, which are memory cell transistors not for use in data storage. The selection gate transistors ST1 and ST2 are each used for the selection of the string unit SU in various operations.

In each NAND string NS, the drain of the selection gate transistor ST1 is connected to the corresponding bit line BL. Between the source of the selection gate transistor ST1 and the drain of the dummy transistor DUT, the memory cell transistors MT48 to MT95 are connected in series. The source of the dummy transistor DUT is connected to the drain of the dummy transistor DLT. Between the source of the dummy transistor DUT and the drain of the selection transistor ST2, the memory cell transistors MT0 and MT47 are connected in series.

In one and the same block BLK, the control gates of the memory cell transistors MT0 are connected together to the word line WL0, the same configuration being applied to the memory cell transistors MT1 to MT95 to the respective word lines WL1 to WL95. The control gates of the dummy transistors DUT are connected together to a dummy word line WLDU. The control gates of the dummy transistors DLT are connected together to a dummy word line WLDL. The gates of the selection gate transistors ST1 included in each of the string units SU0 to SU3 are connected together to selection gate lines SGD0 to SGD3, respectively. The gates of the selection gate transistors ST2 are connected together to a selection gate line SGS.

To the bit lines BL0 to BLm, column addresses different from one another are assigned, respectively. The bit line BL is connected to the selection gate transistors ST1 of the corresponding NAND strings NS in a plurality of blocks BLK. The word lines WL0 and WL95, and the dummy word lines WLDU and WLDL are each provided per block BLK. A source line SL is shared by the plurality of blocks BLK.

A plurality of memory cell transistors MT connected to the same word line WL in one string unit SU are referred to as a cell unit CU. The cell unit CU changes storage capacity in accordance with the number of bits of data to be stored in the memory cell transistor MT. For example, when each memory cell transistor MT stores 1-bit data, the cell unit CU stores 1-page data. Likewise, when each memory cell transistor MT stores 2-bit data, the cell unit CU stores 2-page data. Moreover, when each memory cell transistor MT stores 3-bit data, the cell unit CU stores 3-page data.

Figure 22:
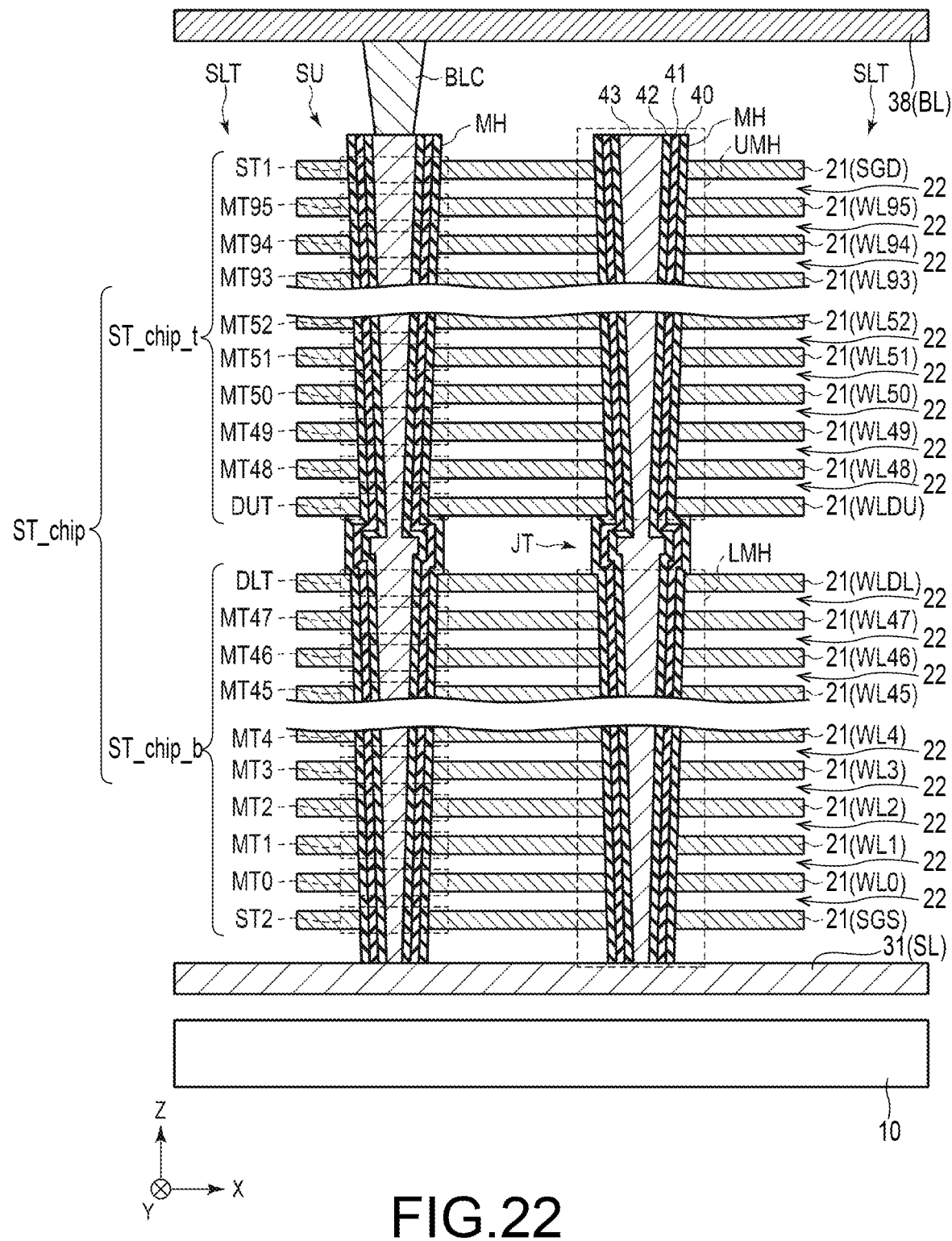
FIG. 22 is a sectional view of a chip region of the semiconductor storage device using the present embodiment.

FIG. 22 is a sectional view of a chip region Rchip of the semiconductor storage device using the present embodiment. FIG. 22 shows the configuration of the memory cell array in the chip region Rchip in more detail, except for an interlayer insulating film between conductive films being omitted. In FIG. 22, two directions orthogonal to each other and parallel to the plane of a semiconductor substrate 10 are defined as an X-direction and a Y-direction, and a direction orthogonal to the X- and Y-directions (XY-plane) is defined as a Z-direction (stacked direction).

The memory cell array includes the semiconductor substrate 10, conductive films 21, 22 and 38, memory pillars MH, and contact plugs BLC. The main surface of the semiconductor substrate 10 corresponds to the XY-plane.

Above the semiconductor substrate 10, a plurality of conductive films 21 are stacked via interlayer insulating films 22. The conductive films 21 are formed in the form of plate along the XY-plane, functioning as a source line SL. The control circuit 11 shown in FIG. 23 may be provided on the semiconductor substrate 10 but under the source line SL. However, in FIG. 22, the illustration of the control circuit 11 is omitted.

On a conductive film 31, a plurality of slits SLT along YZ-plane are arranged in the X-direction. The configuration between the slits SLT adjacent to each other on the conductive film 31, for example, corresponds to one string unit SU. Specifically, on the conductive film 31 and between the slits SLT adjacent to each other, the conductive films 21 and the interlayer insulating films 22 are provided alternately. Among the conductive films 21, the conductive films adjacent to each other in the Z-direction are stacked via the interlayer insulating films 22. The conductive films 21 and the interlayer insulating films 22 each are formed like a plate along the XY-plane.

The conductive film 21 in the lowermost layer functions as a selection gate line SGS. The 48 conductive films 21 above the selection gate line SGS function as word lines WL0 to WL47, respectively, from the lower layer. The conductive film 21 in the uppermost layer of the lower stacked body ST_chip_b and the lowermost conductive film 21 of the upper stacked body ST_chip_t function as dummy word lines WLDL and WLDU, respectively. The 48 conductive films 21 above the dummy word line WLDU function as word lines WL48 to WL95, respectively. The conductive film 21 in the uppermost layer of the upper stacked body ST_chip_t functions as a selection gate line SGD.

The plurality of memory pillars MH are, for example, arranged in a zigzag pattern (not shown) in the Y-direction, each functioning as one NAND string NS. Each memory pillar MH is provided passing through the conductive films 21 and the interlayer insulating films 22 to reach the upper surface of the conductive film 31 (source line SL) from the upper surface of the selection gate line SGD. Each memory pillar MH includes a lower pillar LMH, an upper pillar UMH, and a joint IT between the lower pillar LMH and the upper pillar UMH.

The upper pillar UMH is provided above the lower pillar LMH, both jointed to each other via the joint JT therebetween. In detail, the lower pillar LMH is provided on the conductive film 31, and via the joint IT, the upper pillar UMH is provided on the lower pillar LMH. For example, the outer diameter of the joint IT is larger than the outer diameter of the contact portion of the lower pillar LMH and the joint IT and also larger than the outer diameter of the contact portion of the upper pillar UMH and the joint IT. The gap of a joint layer provided with the joint IT in the Z-direction (between the dummy word lines WLDL and WLDU) is wider than the gap of word lines adjacent to each other in the word lines WL0 to WL47 and WL48 to WL95.

Each memory pillar MH has, for example, a blocking insulating film 40, a charge storage film (also referred to as a charge storage layer) 41, a tunnel insulating film 42, and a semiconductor layer 43. In detail, the blocking insulating film 40 is provided on the inner wall of a memory hole for the formation of the memory pillar MH. The charge storage layer 41 is provided on the inner wall of the blocking insulating film 40. The tunnel insulating film 42 is provided on the inner wall of the charge storage layer 41. Moreover, the semiconductor layer 43 is provided on the inner wall of the tunnel insulating film 42. The memory pillar MH may have a configuration having a core insulating film inside the semiconductor layer 43.

In such a configuration of each memory pillar MH, the portion where the memory pillar MH and the selection gate line SGS cross each other functions as the selection gate transistor ST2. The portions where the memory pillar MH and the word lines WL0 to WL47 cross each other function as the memory cell transistors MT0 to MT47, respectively. Each of the memory cell transistors MT0 to MT47 stores data or is a memory cell capable of storing data. The portions where the memory pillar MH and the dummy word lines WLDL and WLDU cross each other function as the dummy transistors DLT and DUT, respectively. Each of the dummy transistors DLT and DUT is a memory cell that does not store data. The portions where the memory pillar MH and the word lines WL48 to WL95 cross each other function as the memory cell transistors MT48 to MT95, respectively. Each of the memory cell transistors MT48 to MT95 stores data or is a memory cell capable of storing data. The portion where the memory pillar MH and the selection gate line SGD cross each other functions as the selection gate transistor ST1.

The semiconductor layer 43 functions as a channel layer of each of the memory cell transistors MT, the dummy transistors DLT and DUT, and the selection gate transistors ST1 and ST2. Inside the semiconductor layer 43, a current passage of the NAND strings NS is formed.

The charge storage layer 41 has a function of storing charges that are injected from the semiconductor layer 43 in the memory cell transistor MT. The charge storage layer 41 includes, for example, a silicon nitride film.

The tunnel insulating film 42 functions as a potential barrier when charges are injected from the semiconductor layer 43 to the charge storage layer 41 or when charges stored in the charge storage layer 41 diffuse to the semiconductor layer 43. The tunnel insulating film 42 includes, for example, a silicon oxide film.

The blocking insulating film 40 prevents the diffusion of charges stored in the charge storage layer 41 to the word lines WL0 to WL95. The blocking insulating film 40 includes, for example, a silicon oxide film and a silicon nitride film.

Above the upper surfaces of the memory pillars MH, a conductive film 38 is provided via an interlayer insulating film. The conductive film 38 is formed like a line extending in the X-direction, functioning as a bit line (or a wiring layer) BL. A plurality of conductive films 38 (not shown) are arranged in the Y-direction, each electrically connected to one corresponding memory pillar MH per string unit SU. In detail, in each string unit SU, a contact plug BLC is provided on the semiconductor layer 43 in each memory pillar MH and, on the contact plug BLC, one conductive film 38 is provided. The contact plug BLC includes a conductive film.

The configuration of the memory cell array is not limited to the above configuration. For example, the number of the string units SU included in each block BLK can be set to any number. Moreover, the number of the memory cell transistors MT, the dummy transistors DLT and DUT, and the selection gate transistors ST1 and ST2 included in each NAND string NS can also be set to any number.

The number of the word lines WL, the dummy word lines WLDL and WLDU, and the selection gate lines SGD and SGS is changed in accordance with the number of the memory cell transistors MT, the dummy transistors DLT and DUT, and the selection gate transistors ST1 and ST2, respectively. The selection gate line SGS may be configured with a plurality of conductive films provided in a plurality of layers, respectively. The selection gate line SGD may be configured with a plurality of conductive films provided in a plurality of layers, respectively.

The other configurations of the memory cell arrays are described, for example, in U.S. patent application Ser. No. 12/407,403 filed on Mar. 19, 2009 with the title of "three-dimensional stacked nonvolatile semiconductor memory", U.S. patent application Ser. No. 12/406,524 filed on Mar. 18, 2009 with the title of "three-dimensional stacked nonvolatile semiconductor memory", U.S. patent application Ser. No. 12/679,991 filed on Mar. 25, 2010 with the title of "non-volatile semiconductor storage device and manufacturing method thereof", and U.S. patent application Ser. No. 12/532,030 filed on Mar. 23, 2009 with the title of "semiconductor memory and manufacturing method thereof", the entire contents of which are incorporated herein by reference.

Figure 23:
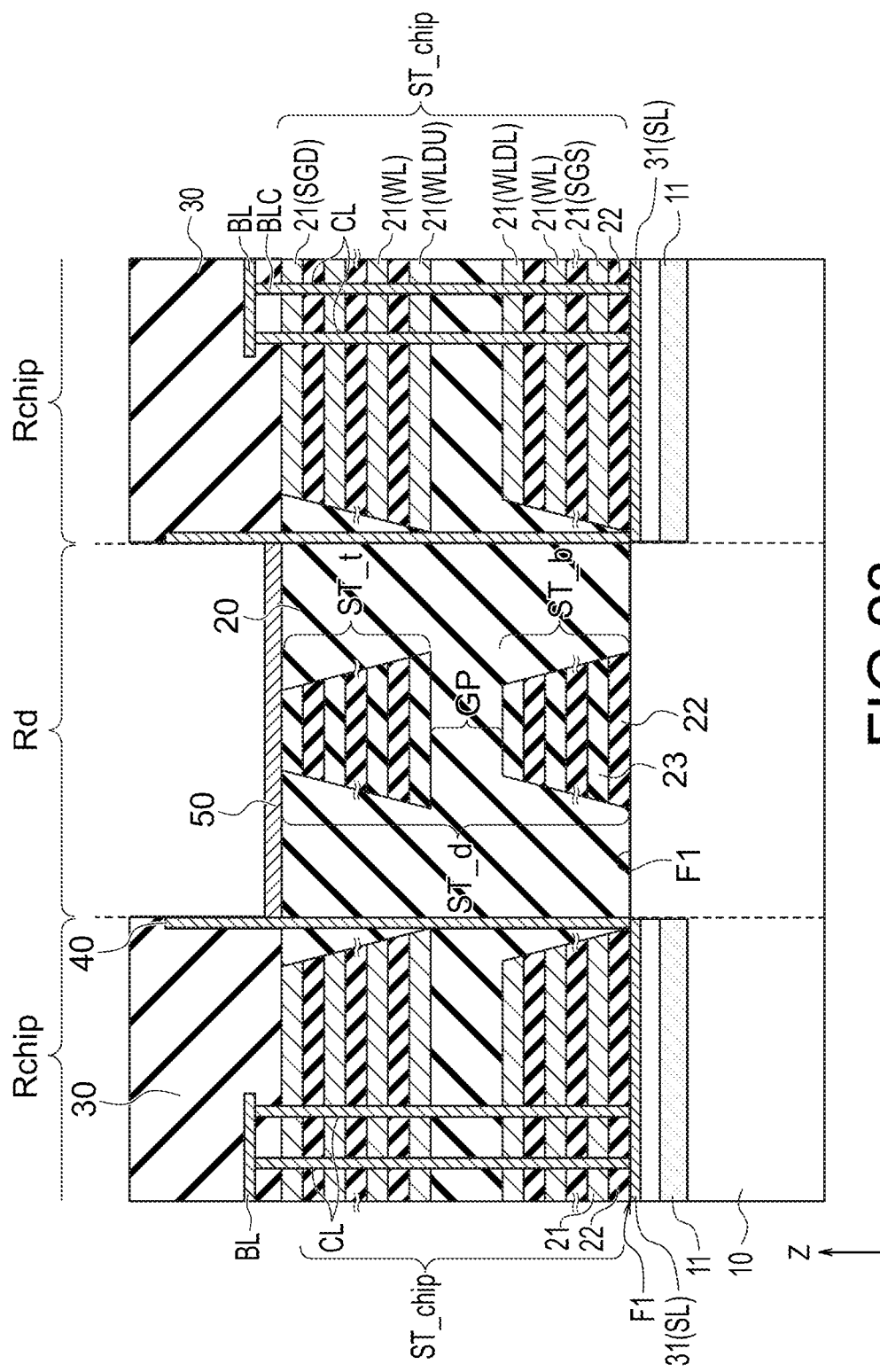
FIG. 23 is a sectional view of a dicing region of the semiconductor storage device using the present embodiment.

FIG. 23 is a sectional view of a semiconductor storage device using the above embodiment, including a dicing region Rd. FIG. 23 shows the stacked configuration in the dicing region Rd in more detail. Although, in FIG. 23, the number of layers of word lines WL in the stacked body ST_chip seems to be different from that of the stacked body ST_chip in FIG. 22, the number of layers is the same between FIGS. 22 and 23.

The stacked body ST_d is configured in the same form of stack as the stacked bodies ST_chip in the chip regions Rchip. In other words, in the dicing region Rd, interlayer insulating films (first insulating films) 22 and second insulating films 23 are alternately provided above the substrate 10. In the chip regions Rchip, the second insulating films 23 have been replaced with the conductive films 21, so that the second insulating films 23 are not provided. However, in the dicing region Rd, the second insulating films 23 remain in the same layers as the conductive films 21.

The second insulating film 23 in the lowermost layer corresponds to the selection gate lines SGS in the device regions Rchip, in the same layer. On the second insulating film 23 in the lowermost layer, another plurality of second insulating films 23 are stacked in order from the lower layer, so as to correspond to the word lines WL0 to WL47, respectively, in the same layers. Over the other plurality of second insulating films 23, a second insulating film 23 is provided corresponding to the dummy word line WLDL in the same layer. In this way, the second insulating films 23 in the same layers as the selection gate line SGS, the word lines WL0 to WL47, and the dummy word line WLDL, respectively, are provided as the lower stacked body ST_b in the dicing region Rd.

On the lower stacked body ST_b, a second insulating film 23 corresponding to the dummy word line WLDU is provided in the same layer. On the second insulating film 23 corresponding to the dummy word line WLDU, a plurality of second insulating films 23 are stacked in order from the lower layer, so as to correspond to the word lines WL48 to WL95, respectively, in the same layers. Over the plurality of second insulating films 23, a second insulating film 23 is provided corresponding to the selection gate line SGD in the same layer. The second insulating film 23 corresponding to the selection gate line SGD is the uppermost layer of the stacked body ST_d. In this way, the second insulating films 23 in the same layers as the dummy word line WLDU, the word lines WL48 to WL95, and the selection gate line SGD, respectively, are provided as the upper stacked body ST_t in the dicing region Rd.

Between the lower stacked body ST_b and the upper stacked body ST_t, a gap GP is provided corresponding to the joint JT in the chip regions Rchip. The width (thickness) of the gap GP in the Z-direction is larger than the gap (thickness of the interlayer insulating film 22) between the second insulating films 23 in the lower stacked body ST_b and the upper stacked body ST_t. For the gap GP, the same material as the interlayer insulating film 22 is used.

The number of the word lines WL, the dummy word lines WLDL and WLDU, and the selection gate lines SGD and SGS may be changed in accordance with the number of the memory cell transistors MT, the dummy transistors DLT and DUT, and the selection gate transistors ST1 and ST2, respectively. In this case, in accordance with the changed number, the number of layers of the conductive films 21 and the second insulating films 23 is also changed in the chip regions Rchip and the dicing region Rd. For example, the selection gate line SGS and SGD may be configured with a plurality of conductive films 21 provided in a plurality of layers, respectively. In this case, the second insulating films 23 corresponding to the selection gate lines SGS and SGD are configured with a plurality of layers, respectively.

In the chip regions Rchip and the dicing region Rd, bit lines BL are provided via contact plugs BLC above the stacked bodies ST_chip and ST_d. Above the stacked bodies ST_chip, a passivation film 30 is provided. In other words, the stacked bodies ST_chip and ST_d are located below the bit lines BL in the vertical direction. The passivation film 30 includes, in its inside, an electrode layer (not shown) provided further above the bit lines BL. On the surface of the passivation film 30, a pad electrode (not shown) for external connection may be formed. The passivation film 30 may be of a stacked configuration of an inorganic insulating film and an organic insulating film such as polyimide.

The stacked body ST_d has the same tapered side face as the stacked bodies ST_chip. This is because the stacked bodies ST_d and ST_chip are formed in the same stacking process and processed in the same etching process.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a first stacked body including a plurality of first insulating films and a plurality of second insulating films alternately stacked; and
a second stacked body including a stacked layer including a plurality of third insulating films and a plurality of first conductive films alternately stacked and a columnar portion provided so as to penetrate the stacked layer, wherein
the second stacked body includes a second lower stacked body and a second upper stacked body on the second lower stacked body,
a diameter of the columnar portion in an upper portion of the second lower stacked body is larger than a diameter of the columnar portion in a lower portion of the second upper stacked body.

2. The semiconductor device according to claim 1, wherein memory cells are provided between the first conductive films and the columnar portion.

3. The semiconductor device according to claim 1, wherein the first insulating films and third insulating films include silicon oxide.

4. The semiconductor device according to claim 3, wherein the second insulating films include silicon nitride, and
the first conductive films include tungsten.

5. The semiconductor device according to claim 1 further comprising:
a substrate; and
a first via provided closer to an outer edge of the substrate than the second stacked body, a length of the first via along a first direction which is a direction along a stacked direction of the second lower stacked body and the second upper stacked body being longer than a length of the first stacked body along the first direction, wherein
the first stacked body is provided closer to the outer edge of the substrate than the first via.

6. The semiconductor device according to claim 5, wherein the first via includes tungsten.

7. The semiconductor device according to claim 1 further comprising a substrate, wherein
a source layer is provided closer to the substrate than the second stacked body, and
a bit line is provided more distant from the substrate than the second stacked body.

8. The semiconductor device according to claim 1, wherein an end of the columnar portion is connected to a source layer, and
another end of the columnar portion is connected to a bit line.

9. The semiconductor device according to claim 1 further comprising:
a first protection layer overlapping the second stacked body in a view from a first direction which is a direction along a stacked direction of the second lower stacked body and the second upper stacked body.

10. The semiconductor device according to claim 9, wherein the first protection layer is a stacked body of an inorganic insulating film and an organic insulating film.

11. The semiconductor device according to claim 1, wherein a first protection layer includes a first lower stacked body and a first upper stacked body on the first lower stacked body,
a thickness of a fourth insulating film between one of the second insulating films uppermost of the first lower stacked body and one of the second insulating films lowermost of the first upper stacked body is thicker than a thickness of the first insulating films included in the first lower stacked body or the first upper stacked body.

12. A semiconductor device comprising:
a first stacked body including a plurality of first insulating films and a plurality of second insulating films alternately stacked; and
a second stacked body including a stacked layer including a plurality of third insulating films and a plurality of first conductive films alternately stacked and a columnar portion provided so as to penetrate the stacked layer, wherein
the second stacked body includes a second lower stacked body and a second upper stacked body on the second lower stacked body, a diameter of the columnar portion in an upper portion of the second lower stacked body is larger than a diameter of the columnar portion in a lower portion of the second upper stacked body, wherein the first insulating films and third insulating films include silicon oxide, the second insulating films include silicon nitride, and the first conductive films include tungsten, memory cells are provided between the first conductive films and the columnar portion, an end of the columnar portion is connected to a source layer, and another end of the columnar portion is connected to a bit line.

13. The semiconductor device according to claim 12 further comprising:

a substrate, wherein the first stacked body is provided closer to an outer edge of the substrate than the second stacked body.

14. The semiconductor device according to claim 12, wherein a first protection layer includes a first lower stacked body and a first upper stacked body on the first lower stacked body, a thickness of a fourth insulating film between one of the second insulating films uppermost of the first lower stacked body and one of the second insulating films lowermost of the first upper stacked body is thicker than a thickness of the first insulating films included in the first lower stacked body or the first upper stacked body.

* * * * *